US006831997B2

(12) United States Patent
Kamon

(10) Patent No.: US 6,831,997 B2
(45) Date of Patent: Dec. 14, 2004

(54) MASK DATA CORRECTION APPARATUS, FOURIER TRANSFORMATION APPARATUS, UP SAMPLING APPARATUS, DOWN SAMPLING APPARATUS, METHOD OF MANUFACTURING TRANSFER MASK, AND METHOD OF MANUFACTURING DEVICE HAVING PATTERN STRUCTURE

(75) Inventor: Kazuya Kamon, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 629 days.

(21) Appl. No.: 09/827,903

(22) Filed: Apr. 9, 2001

(65) Prior Publication Data

US 2002/0018599 A1 Feb. 14, 2002

(30) Foreign Application Priority Data

Jul. 14, 2000 (JP) ........................................ 2000-214002

(51) Int. Cl.[7] .............................. G06K 9/00; G06K 9/20
(52) U.S. Cl. ........................ 382/144; 382/280; 382/299; 382/300
(58) Field of Search ................................ 382/144, 280, 382/145, 147, 299, 300

(56) References Cited

U.S. PATENT DOCUMENTS

| | | | | | |
|---|---|---|---|---|---|
| 5,502,654 | A | * | 3/1996 | Sawahata | .................... 382/280 |
| 6,081,659 | A | * | 6/2000 | Garza et al. | ................... 716/21 |
| 6,171,731 | B1 | * | 1/2001 | Medvedeva et al. | ........... 430/5 |
| 6,263,299 | B1 | * | 7/2001 | Aleshin et al. | ................. 703/5 |
| 6,272,236 | B1 | * | 8/2001 | Pierrat et al. | ............... 382/144 |
| 6,496,597 | B1 | * | 12/2002 | Tampieri | ..................... 382/154 |

FOREIGN PATENT DOCUMENTS

| JP | 61-221963 | 10/1986 |
|---|---|---|
| JP | 7-288224 | 10/1995 |
| JP | 8-297692 | 11/1996 |
| JP | 9-167731 | 6/1997 |
| JP | 10-335224 | 12/1998 |
| JP | 11-272724 | 10/1999 |

OTHER PUBLICATIONS

CQ Publishing Company, pp. 102–105 and 148–155, "Waveform Data Processing for Scientific Instrumentation", Nov. 30, 1986.

Y. C. Pati, et al., Information Systems Laboratory, Department of Electrical Engineering, Stanford University, SPIE vol. 2197, pp. 314–327 and 376, "Phase–Shifting Masks: Automated Design and Mask Requirements", 1994.

(List continued on next page.)

*Primary Examiner*—Jon Chang
*Assistant Examiner*—Wesley Tucker
(74) *Attorney, Agent, or Firm*—Oblon, Spivak, McClelland, Maier & Neustadt, P.C.

(57) ABSTRACT

A mask data correction apparatus that can increase efficiency of processing while maintaining high accuracy by effectively using the hierarchical structure of a layout data: A Fourier transformation part performs Fourier transformation of base elements defined by the layout data to obtain Fourier images of the base elements. A synthesizing part superimposes, based on the hierarchical structure, the Fourier images of the base elements in Fourier space, to obtain a Fourier image of the entire graphic. A spatial filter part subjects the Fourier image of the entire graphic to spatial filter processing that corresponds to distortion expected in a manufacturing process. An inverse Fourier transformation part performs inverse Fourier transformation of the Fourier image after spatial filter processing, to obtain the inverse Fourier image reflecting the distortion. The graphic defined by the layout data is compared with the graphic of which inverse Fourier image has been transformed, and is corrected in such a direction as to suppress distortion, and then is outputted as a mask data.

15 Claims, 24 Drawing Sheets

OTHER PUBLICATIONS

Yao–Ting Wang, et al, Information Systems Laboratory, Department of Electrical Engineering, Stanford University, SPIE vol. 2197, pp. 377–387, "Systematic Design of Phase–Shifting Masks", 1994.

Michael S. Yeung, Optical/Laser Microlithography, SPIE vol. 922, pp. 149–167, "Modeling High Numerical Aperture Optical Lithography", 1988.

Michael Yeung, Intel Corporation, pp. 115–126, "Modeling Aerial Images in Two and Three Dimensions".

Eytan Barouch, et al., J. Vac. Sic.. Technol. B, vol. 8, No. 6, pp. 1432–1437, "Positive Photoresist Process Simulation Over Nonplanar Substrates", Nov./Dec. 1990.

Eytan Barouch, et al., IEEE Electron Device Letters, vol. 12, No. 10, pp. 513–514, "Modeling Process Latitude in UV Projection Lithography", Oct. 1991.

Eytan Barouch, et al., Electron–Beam, X–Ray, and Ion–Beam Submicrometer Lithographies for Manufacturing, SPIE vol. 1465, pp. 254–261, "Process Latitudes in Projection Printing", 1991.

Kazuya Kamon, et al., Photomask and X–Ray Mask Technology II, SPIE vol. 2512, 13 pages, "Optical Proximity Correction for Super Resolution Technique", Apr. 20–21, 1995.

Tetsuro Hanawa, et al., Optical Microlithography IX, SPIE vol. 2726, pp. 640–650, "Fast and Accurate Optical Proximity Correction Based on Aerial Image Simulation", Mar. 1996.

Akihiro Nakae, et al., Jpn. J. Appl. Phys. vol. 35, Pt. 1, No. 12B, pp. 6395–6399, "Precision Improvement in Optical Proximity Correction by Optimizing Second Illumination Source Shape", Dec. 1996.

* cited by examiner

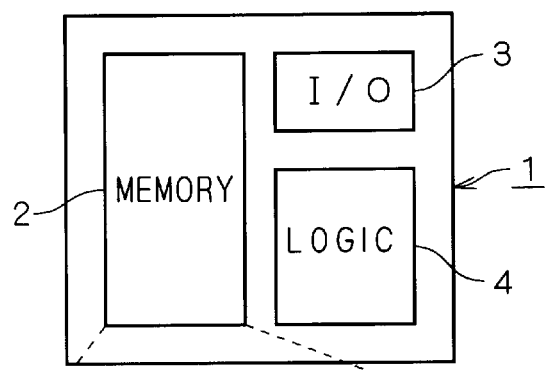
F I G . 4 A
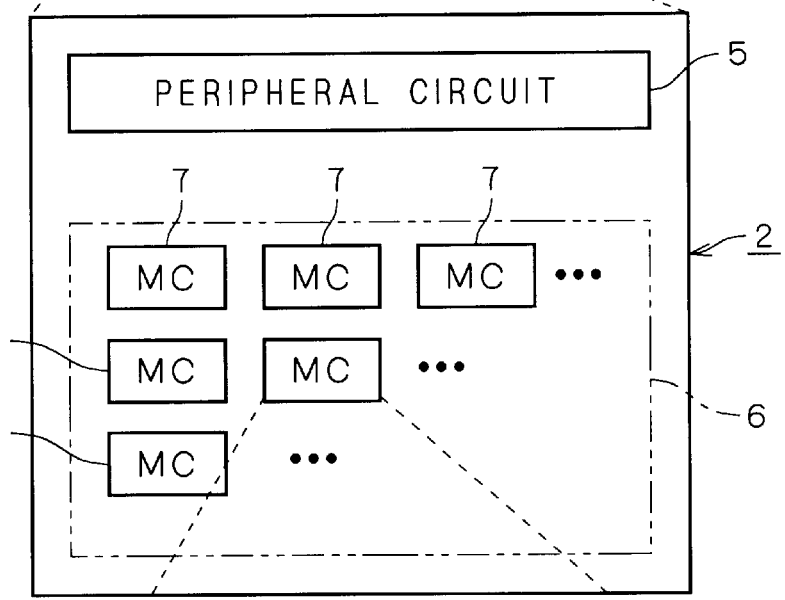
F I G . 4 B
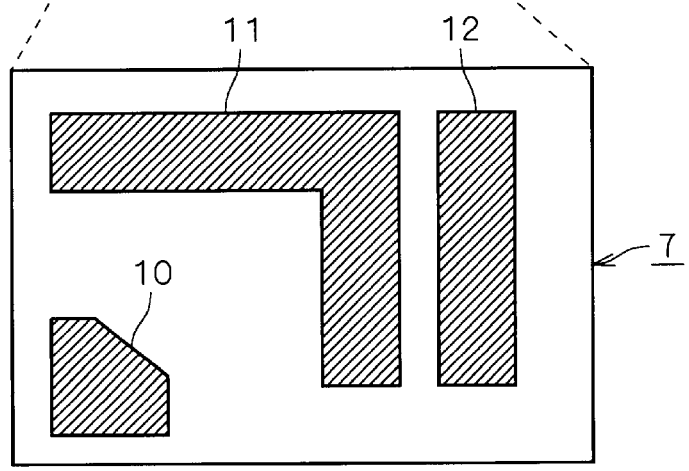
F I G . 4 C

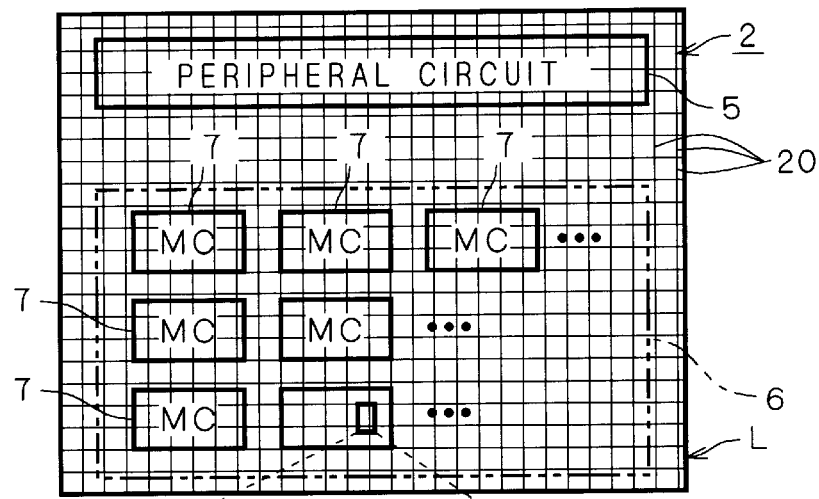
F I G . 5A
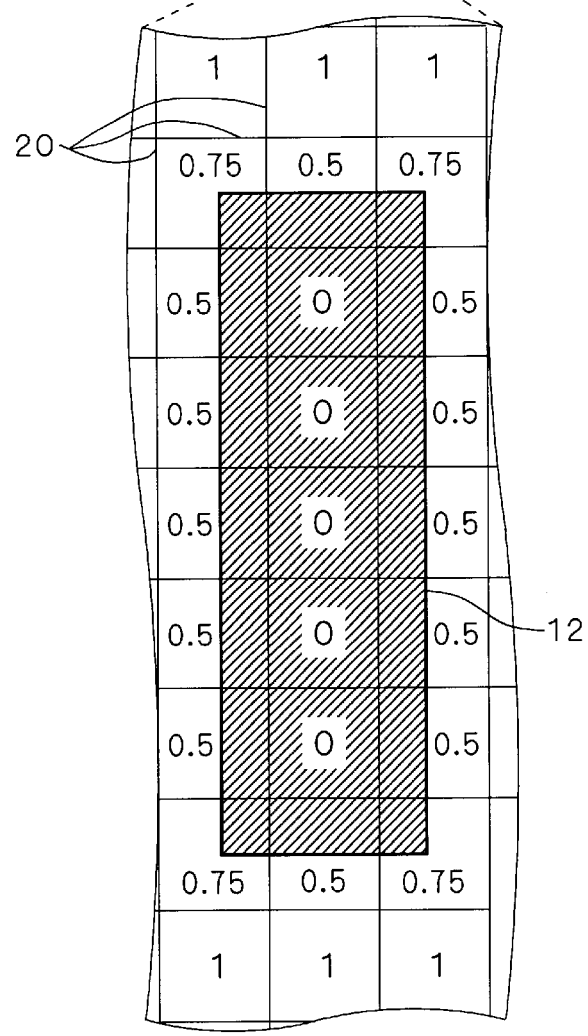
F I G . 5B

F I G . 1 3
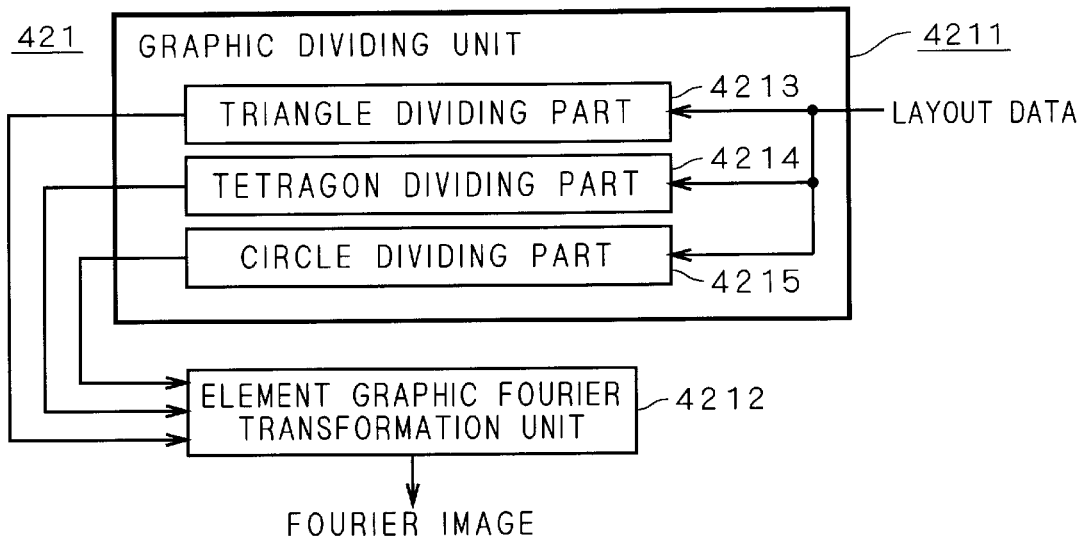
F I G . 1 4
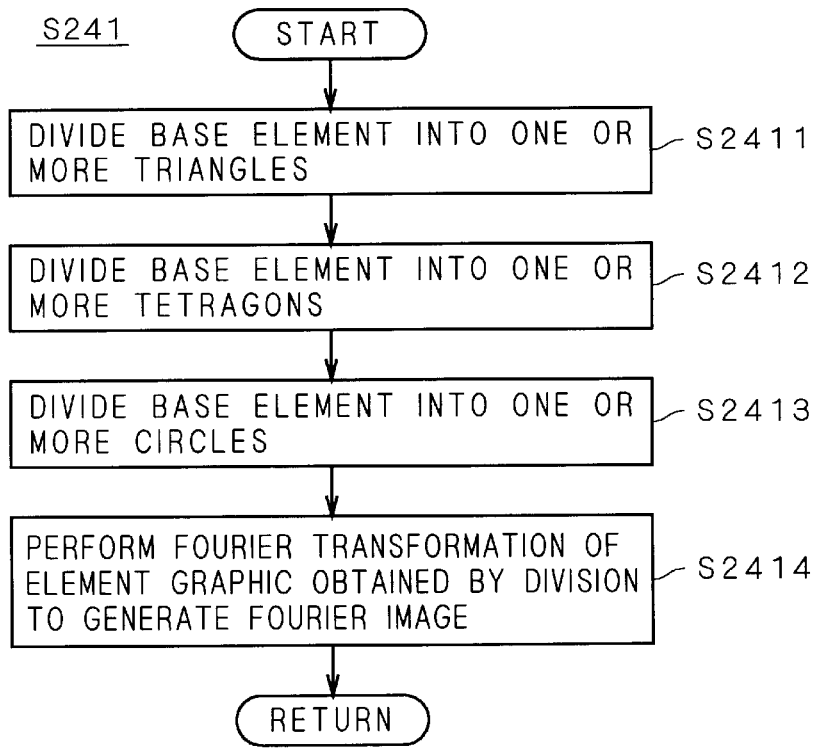

F I G . 15
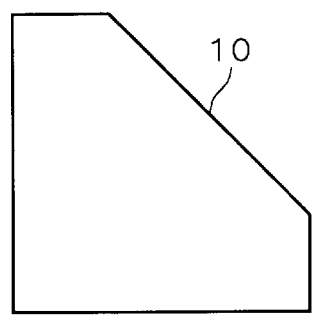
F I G . 16
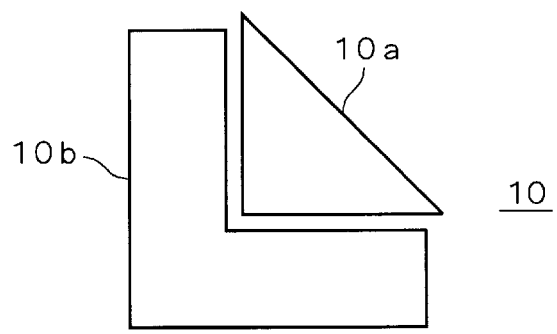
F I G . 17
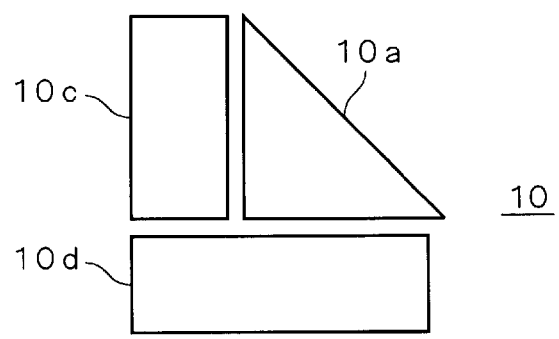

F I G . 18
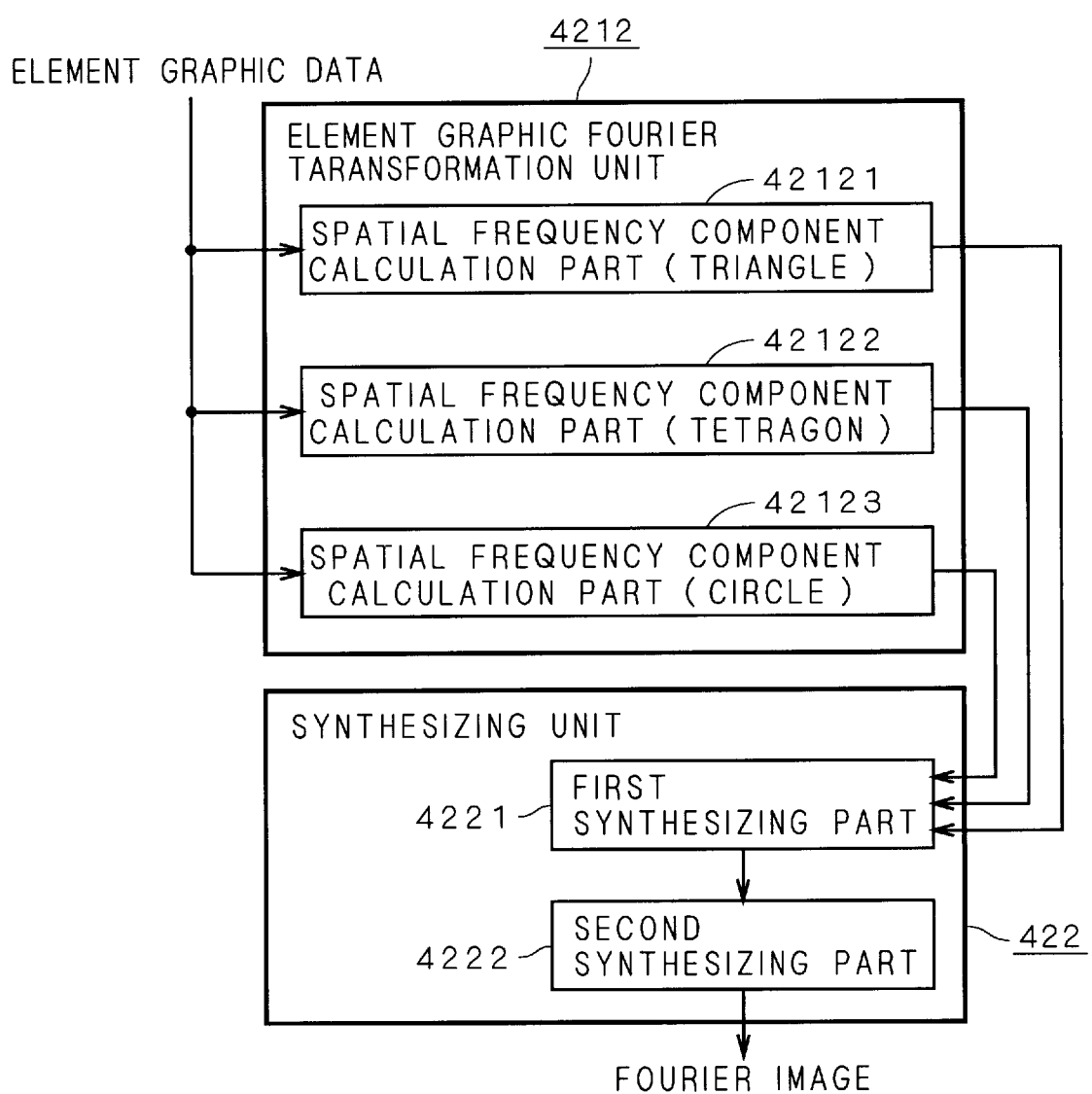

FOURIER SPACE

REAL SPACE

REAL SPACE

REAL SPACE

F FOURIER SPACE

REAL SPACE

F I G . 3 0
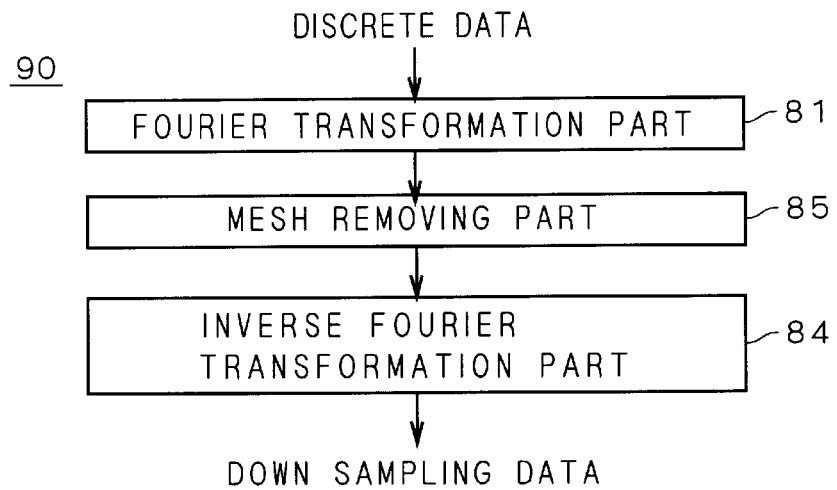
F I G . 3 1
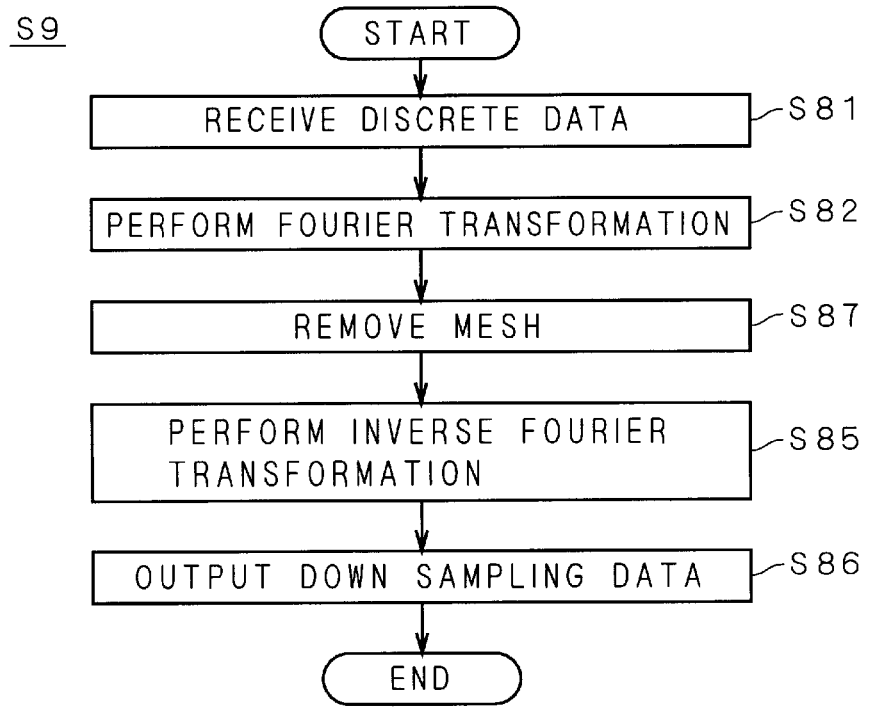

< BACKGROUND ART >

MASK DATA CORRECTION APPARATUS, FOURIER TRANSFORMATION APPARATUS, UP SAMPLING APPARATUS, DOWN SAMPLING APPARATUS, METHOD OF MANUFACTURING TRANSFER MASK, AND METHOD OF MANUFACTURING DEVICE HAVING PATTERN STRUCTURE

BACKGROUND OF THE INVENTION

1. Field of the Invention

The present invention relates to a mask data correction apparatus, a Fourier transformation apparatus, an up sampling apparatus, a down sampling apparatus, a method of manufacturing a transfer mask, and a method of manufacturing a device having a pattern structure. In particular, the invention relates to improvements in increasing efficiency while maintaining accuracy.

2. Description of the Background Art

In recent years, the advance of scale down in large scale integrated circuits (LSIs) has been tremendous. This is owing to the development of micro-lithography technology. Especially, light transfer technology has still been in the center of micro-lithography technology because of high throughput by mass exposure, achievement of optical technology continuously developed over 100 years, and the like.

However, now that the fabrication size of micro-patterns is smaller than the wavelength of an exposure light, it is important to establish the limitation of light transfer technology and to overcome the limitation of resolution and depth of focus. In order to perform such analysis, a technique of performing optical image calculation and a technique of correcting distortion generated from the calculated optical image are now arousing interest. FIG. 32 is a flow chart illustrating, as one particular example, a procedure of a mask data correction method which was invented by the present inventor and disclosed in Japanese Patent Application Laid-Open No. 8-297692 (1996) (hereinafter referred to as "literature I").

This method is fully described in literature I and is known in the art, and it will be thus discussed briefly hereinbelow. When process S90 of this method is started, a circuit design and a layout design are performed (S91, S92), and initially a layout data is stored in a record medium (S93). The layout data defines the shape and hierarchical structure of base elements of a graphic having a hierarchical structure. The layout data is then expanded (S94), and a process condition is inputted (S95). Thereafter, meshes are formed (S96) and an image calculation is performed (S97). In comparison of the result of the image calculation with the layout data, a graphic correction is made (S98), and a correction data as being the result is outputted (S99), thereby completing process S90.

When using these techniques, attentions should be given also to degradation of an optical image that is caused by aberration of an optical system. These techniques are fully described in Japanese Patent Application Laid-Open No. 9-167731 (1997) (hereinafter referred to as "literature II") or No. 10-335224 (1998) (hereinafter referred to as "literature II"), which were invented by the present inventor. In some cases, a long range correlation of full shot level may cause a problem.

In order to perform such evaluation or optimization, it is necessary to check the consistency between the result of calculation and the result of experiment about optical images with regard to various cases. However, the optical image calculation usually requires a large quantity of calculation because, for example, it is required that a mask graphic is subjected to Fourier transformation, followed by inverse Fourier transformation. Thus, numerous proposals for performing Fourier transformation at high speed has been presented. The following methods are generally known.

(1) FFT (Fast Fourier Transformation) which is disclosed in, e.g., "Waveform Data Processing for Scientific Instrumentation" by Shigeo Minami, CQ publishing company;

(2) OCA (Optical Coherent Approximation) which is disclosed in, e.g., Y. C Pali and T. Kailath J. OP Soc. Am A, Vol. 11(1994)2438;

(3) Irregular intervals Fourier transformation which is disclosed in, e.g., E. Barouch, B. Bradie, U. Hollerbach, and S. A. Orszag, J. Vac. Sci. and Technol. B8(1990)1432; E. Barouch, B. Bradie, U. Hollerbach, and S. A. Orszag, Proc. SPIE Vol. 1465(1991)254; and E. Barouch, U. Hollerbach, S. A. Orszag, B. Bradie and M. Peckcrar, IEEE Electron Device Lett., EDL-12 (1991)513;

(4) Partial coherent approximation which is disclosed in, e.g., M. Yeung: Proc, Kodak Microelectronics Seminar INTERFACE '85 (KTI Chemicals, Inc, San Diego, 1986) p.115; and M. Yeung: Proc. SPIE Vol. 922(1988) 149; and (5) Massively parallel operation which is disclosed in, e.g., K. Kamon, W. Wakamiya, H. Nagata, K. Moriizumi, T. Miyamoito, Y. Myoi and M. Tanaka; Proc, SPIE Vol. 2512(1995)491; T. Hanawa, K. Kamon, A. Nakae, S. Nakao and K. Moriizumi: Proc, SPIE Vol. 2726(1996)640; and A. Nakae, K. Kamon, T. Hanawa, K. Moriizumi and S. Nakao: Jpn. J. Appl. Phys. Vol.35(1996)6395.

Through these techniques, remarkable high speed has recently been obtained. These techniques, each being extremely effective, have contributed markedly to the innovation of micro-lithography technology. However, a full shot calculation of LSIs cannot be performed satisfactorily even in combination of these, for reasons which are discussed hereinbelow. For instance, in the case of a DRAM of 1G (giga) bit that is under development, a vast number of transistors of 1G are closely disposed longitudinally and transversely to form a memory array. Further, even a logic device has such a configuration that a lot of small-size RAMs are contained. Furthermore, it is assumed that LSIs will be further subjected to high integration in the future.

Conventionally, such a method that a graphic data is processed after a temporal flat expansion (e.g., "dracula" by Cadence Corp.) has usually employed. Whereas in order to handle a large number of graphics, there has recently been developed an apparatus in which operations such as layout verification are performed by utilizing the hierarchical structure of a graphic data (e.g., "hercules" by Arant Corp.; "caliber" by Menter Corp.; and "clover" by Lucent Corp.). In these apparatuses, as shown in FIG. 33, high speed processing has been attained by collecting some data at cells 91, and performing a graphic operation while maintaining the relative disposition of cells and the hierarchical structure. In FIG. 33, a plurality of cells 91 are disposed in an image forming region 90, and a graphic base element 92 is disposed in the cells 91.

Since these apparatuses can perform simple operation and comparison between graphics at high speed, they are suitable for use in design rule check, logic operation between simple graphics, or sizing.

However, when a certain graphic influence or correlation is exerted widely over a plurality of cells, it is required to expand each element cell. Thus, it is known not only that high speed data processing cannot be attained but also that processing capacity is lowered in some cases.

In application to optical image calculation, a certain graphic influence extends within the coherence length of an optical system. In some cases, micro loading effect in dry etching or proximity effect in mask drawing extends to about 10 μm. It is therefore necessary to calculate the state that graphic elements interfere or influence with each other. It can be said that such correlation state calculation is rather essential in a variety of process simulations including lithography. Since the above-mentioned optical coherency or various proximity effects usually extend over a plurality of cells, it has conventionally been necessary to expand all the cells for evaluation. As a result, even if the hierarchical data is used in proximity correction calculation, it is finally required to expand all the cells. This makes it impossible to sufficiently exhibit the effectiveness of hierarchical processing.

SUMMARY OF THE INVENTION

It is an object of the present invention to overcome the disadvantages in the prior art by providing a mask data correction apparatus, a Fourier transformation apparatus, an up sampling apparatus, a down sampling apparatus, a method of manufacturing a transfer mask, and a method of manufacturing a device having a pattern structure, each of which is capable of increasing processing efficiency while maintaining high accuracy, by the effective use of the hierarchical structure of a layout data.

According to a first aspect of the invention, a mask data correction apparatus in which based on a layout data defining the shape of base elements of a graphic having a hierarchical structure and the hierarchical structure and on a manufacturing process condition, a mask data expressing the pattern form of a transfer mask used in the manufacturing process is created in such a manner as to suppress a distortion expected in the manufacturing process, comprises: a Fourier transformation part to obtain Fourier images of the base elements by performing Fourier transformation of the base elements; a synthesizing part to obtain Fourier image of the graphic by synthesizing the Fourier images of the base elements in Fourier space, based on the hierarchical structure; a spatial filter part subjecting the Fourier image of the graphic to spatial filter processing corresponding to the distortion; an inverse Fourier transformation part subjecting the Fourier image after the spatial filter processing to inverse Fourier transformation, thereby to obtain the inverse Fourier image reflecting the distortion; a graphic transformation part to transform the inverse Fourier image into a graphic; and a graphic correction part to correct the graphic defined by the layout data in such a direction as to suppress the distortion by comparing the graphic outputted from the graphic transformation part with the graphic defined by the layout data, and to output the result as the mask data.

According to a second aspect of the invention, the mask data correction apparatus of the first aspect is characterized in that the distortion includes a drawing distortion caused when the transfer mask is formed by electron beam drawing based on the mask data.

According to a third aspect of the invention, the mask data correction apparatus of the first or second aspect is characterized in that the distortion includes a transfer distortion caused in a transfer image when transfer is performed by using the transfer mask formed based on the mask data.

According to a fourth aspect of the invention, the mask data correction apparatus of the first, second or third aspect is characterized in that the distortion includes an etching distortion caused in an etching pattern when selective etching is performed by using a resist pattern formed by transferring the transfer mask formed based on the mask data.

According to a fifth aspect of the invention, the mask data correction apparatus of one of the first to fourth aspects is characterized in that the distortion includes a polishing distortion caused in a polished pattern when polishing processing of a deposited film is performed after selective etching is performed with a resist pattern formed by transferring the transfer mask formed based on the mask data.

According to a sixth aspect of the invention, the mask data correction apparatus of one of the first to fourth aspects is characterized in that the distortion includes an etch back distortion caused in the pattern subjected to etch back when etch back processing of a deposited film is performed after selective etching is performed with a resist pattern formed by transferring the transfer mask formed based on the mask data.

According to a seventh aspect of the invention, the mask data correction apparatus of one of the first to sixth aspects is characterized in that the Fourier transformation part comprises: a graphic dividing part dividing the base element into a group of element graphics in the form of a triangle, tetragon or circle; and an element graphic Fourier transformation part to perform Fourier transformation per element graphic of the group of element graphics, thereby to obtain their respective Fourier images.

According to an eighth aspect of the invention, the mask data correction apparatus of the seventh aspect is characterized in that the element graphic Fourier transformation part performs integral calculation analytically by using a primitive function, when calculation of spatial frequency components is made to obtain the Fourier image.

According to a ninth aspect of the invention, the mask data correction apparatus of one of the first to eighth aspects further comprises a mesh forming part to set an image forming region in real space and the Fourier space and to set meshes in the image forming region, the mesh forming part comprising: a minimum correlation distance calculating part to calculate a minimum correlation distance in the manufacturing process, based on the manufacturing process condition; and a mesh number optimizing part to determine the number of meshes along two directions crossing in the image forming region such that the mesh width is the largest in the range not exceeding the minimum correlation distance and the number of meshes is a positive integer.

According to a tenth aspect of the invention, the mask data correction apparatus of the ninth aspect is characterized in that the mesh number optimizing part limits the positive integer to a positive integer n that is defined by $n=2^i 3^j 5^k$ (i, j and k are each zero or a positive integer), and the Fourier transformation part performs the Fourier transformation by using fast Fourier transformation.

According to an eleventh aspect, the mask data correction apparatus according to one of the first to eighth aspects further comprises: a mesh forming part to set an image forming region in real space and the Fourier space and to set meshes in the image forming region; a mesh adding part to add a new mesh into the image data obtained after the spatial filter processing; and a new mesh data setting part to set the value of zero to the image data on the added mesh and then to output the result together with the image data before the mesh is added, and wherein the inverse Fourier transformation part performs the inverse Fourier transformation of the image data outputted from the new mesh data setting part.

According to a twelfth aspect of the invention, the mask data correction apparatus of one of the first to eighth aspects further comprises: a mesh forming part to set an image forming region in real space and the Fourier space and to set meshes in the image forming region; and a mesh removing part to remove some of meshes from the image data obtained after the spatial filter processing, and wherein the inverse Fourier transformation part performs the inverse Fourier transformation of the image data outputted from the mesh removing part.

According to a thirteenth aspect, a method of manufacturing a transfer mask comprises the steps of: (a) creating a mask data by using the mask data correction apparatus according to one of the first to twelfth aspects; and (b) forming a transfer mask by using the mask data created in the step (a).

According to a fourteenth aspect, a method of manufacturing a device having a pattern structure comprises the steps of: (a) creating a mask data by using the mask data correction apparatus according to one of the first to twelfth aspects; (b) forming a transfer mask by using the mask data created in the step (a); (c) forming a resist on the surface of a material of a device to be manufactured; (d) transferring the transfer mask formed in the step (b) to the resist; (e) patterning the resist in the pattern form transferred in the step (d); and (f) performing selective processing of the material by using the patterned resist as a shield.

According to a fifteenth aspect, a Fourier transformation apparatus subjecting a graphic having a hierarchical structure to Fourier transformation, comprises: a graphic dividing part to divide a base element of the hierarchical structure into a group of element graphics in the form of a triangle, tetragon or circle; an element graphic Fourier transformation part in which Fourier transformation is performed per element graphic of the group of element graphics, thereby to obtain their respective Fourier images; and a synthesizing part to obtain Fourier image of the graphic by synthesizing the Fourier image of the base element in Fourier space, based on the hierarchical structure.

According to a sixteenth aspect, an up sampling apparatus subjecting a discrete data to up sampling, comprises: a Fourier transformation part to transform the discrete data into a set of frequency components, by performing Fourier transformation of the discrete data defined in one or more dimensional space; a mesh adding part to make the set of frequency components into data on meshes set in Fourier space of the same dimension as the above-mentioned one or more dimension, and to add a new mesh into the Fourier space; a new mesh data setting part to set the value of zero to the data on the added mesh and to output the result together with the data on the meshes before addition; and an inverse Fourier transformation part performing inverse Fourier transformation of data outputted from the new mesh data setting part.

According to a seventeenth aspect, a down sampling apparatus subjecting a discrete data to down sampling, comprises: a Fourier transformation part to transform the discrete data into a set of frequency components, by performing Fourier transformation of the discrete data defined in one or more dimensional space; a mesh removing part to make the set of frequency components into data on meshes set in Fourier space of the same dimension as the above-mentioned one or more dimension, and to output the result after removing a part of the meshes in the Fourier space; and an inverse Fourier transformation part performing inverse Fourier transformation of data outputted from the mesh removing part.

In the apparatus of the first aspect of the invention, the Fourier image of the entire graphic can be obtained by synthesizing the Fourier images of base elements, based on the hierarchical structure. Thereby, a mask data in which a large number of base elements are contained in a graphic can be corrected at high efficiency while maintaining accuracy.

In the apparatus of the second aspect of the invention, correction is made so as to suppress a distortion including a drawing distortion, thereby to obtain a mask data capable of suppressing the drawing distortion that appears on the transfer mask.

In the apparatus of the third aspect of the invention, correction is made so as to suppress a distortion including a transfer distortion, thereby to obtain a mask data capable of suppressing the transfer distortion that appears on the transfer image.

In the apparatus of the fourth aspect of the invention, correction is made so as to suppress a distortion including an etching distortion, thereby to obtain a mask data capable of suppressing the etching distortion that appears on the etching pattern.

In the apparatus of the fifth aspect of the invention, correction is made so as to suppress a distortion including a polishing distortion, thereby to obtain a mask data capable of suppressing the polishing distortion that appears on the polished pattern.

In the apparatus of the sixth aspect of the invention, correction is made so as to suppress a distortion including an etch back distortion, thereby to obtain a mask data capable of suppressing the etch back distortion that appears on the pattern after etch back.

In the apparatus of the seventh aspect of the invention, the Fourier image of the entire graphic is obtained by dividing the base element into the group of element graphics, each being in the form of a triangle, tetragon or circle; performing Fourier transformation per element graphic; and superimposing the results thus obtained. Therefore, even if the base element has any complicated shape, Fourier transformation to the entire graphic can be achieved in short time without degradation of accuracy. As a result, the mask data can be corrected at higher efficiency without degradation of accuracy.

In the apparatus of the eighth aspect of the invention, by utilizing the fact that a base element is divided into a group of element graphics of simple shape, when calculating spatial frequency components, definite integral calculation is performed analytically by using a primitive function. Thereby, the accuracy of Fourier transformation is further improved while the time required for calculation is further reduced.

In the apparatus of the ninth aspect, the number of meshes is optimized. Therefore, the mask data correction is attainable at high accuracy without requiring the wasteful calculation time.

In the apparatus of the tenth aspect of the invention, the number of meshes is limited to an adequate number for fast Fourier transformation and Fourier transformation is performed by employing fast Fourier transformation. Thereby, the efficiency of calculation is increased without degradation of accuracy.

In the apparatus of the eleventh aspect of the invention, interpolation reflecting the entire graphic is performed because up sampling is carried out in Fourier space. Therefore, there is provided the corrected mask data which is smooth and natural and is unavailable merely by linear interpolation or the like.

In the apparatus of the twelfth aspect of the invention, interpolation that reflects the entire graphic is performed because down sampling is carried out in Fourier space. Therefore, although the number of meshes is reduced, there is provided the corrected mask data which is smooth and natural and is unavailable merely by linear interpolation or the like.

In the method of the thirteenth aspect of the invention, a mask data is created by using the mask data correction apparatus of the present invention, and a transfer mask is formed by using the mask data. Thereby, a transfer mask of high accuracy can be obtained at high efficiency.

In the method of the fourteenth aspect of the invention, a mask data is created by using the mask data correction apparatus of the present invention, and a transfer mask is formed by using the mask data, and further, the transfer mask is used when performing transfer to a resist, patterning of the resist, and selective processing. Thereby, a device having a pattern structure of high accuracy can be obtained at high efficiency.

In the apparatus of the fifteenth aspect of the invention, the Fourier image of the entire graphic is obtained by dividing a base element into a group of elements graphics, each being in the form of a triangle, tetragon or circle; performing Fourier transformation per element graphic; and superimposing the results thus obtained. Therefore, even if the base element has any complicated shape, Fourier transformation to the entire graphic can be achieved in short time without degradation of accuracy.

In the apparatus of the sixteenth aspect of the invention, interpolation reflecting the entire graphic is performed because up sampling is carried out in Fourier space. Therefore, there is provided the data after up sampling which is smooth and natural and is unavailable merely by linear interpolation or the like.

In the apparatus of the seventeenth aspect of the invention, interpolation reflecting the entire graphic is performed because down sampling is carried out in Fourier space. Therefore, although the number of meshes is reduced, there is provided the data after down sampling which is smooth and natural and is unavailable merely by linear interpolation or the like.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4A to 4C are explanatory diagrams of a process according to a first preferred embodiment;

FIGS. 5A, 5B and 6 are explanatory diagrams of the operation of an image calculation unit;

FIG. 13 is a block diagram illustrating an internal configuration of a Fourier transformation part;

FIG. 14 is a flow chart illustrating the process performed by the Fourier transformation part;

FIGS. 15, 16 and 17 are operational diagrams of the process performed by the Fourier transformation part;

FIG. 18 is a block diagram illustrating an internal configuration of an element graphic Fourier transformation part and a synthesizing unit;

FIG. 30 is a block diagram illustrating an internal configuration of a down sampling unit;

FIG. 31 is a flow chart illustrating the process performed by the down sampling unit;

DESCRIPTION OF THE PREFERRED EMBODIMENTS

First Preferred Embodiment

Figure 1:
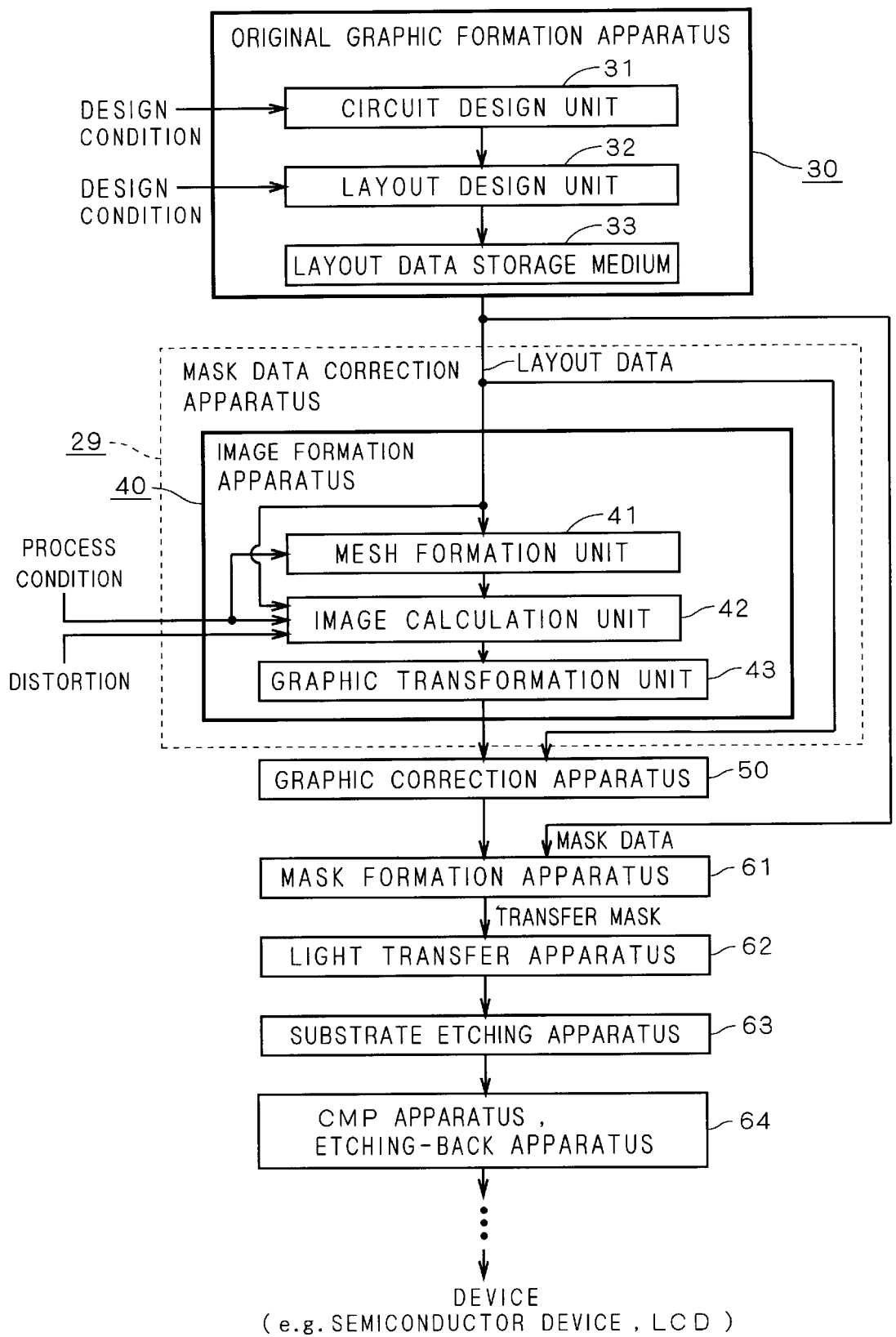
FIG. 1 is a block diagram of various manufacturing apparatus according to preferred embodiments of the present invention.
Figure 2:
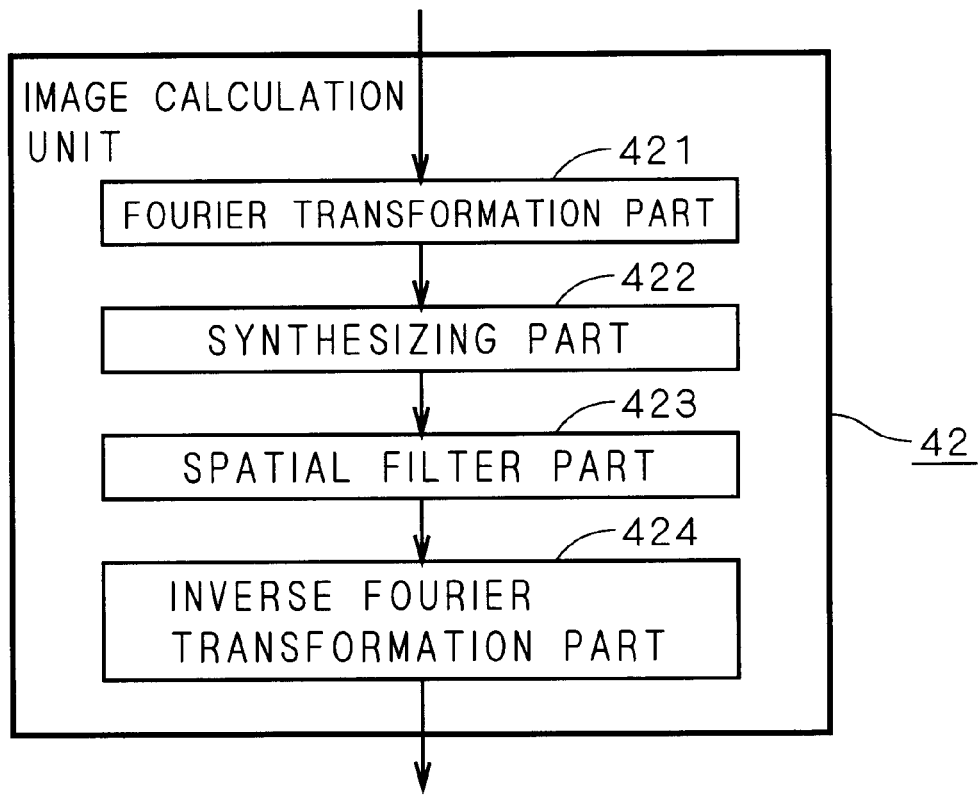
FIG. 2 is a block diagram illustrating an internal configuration of an image calculation unit in FIG. 1.
Figure 3:
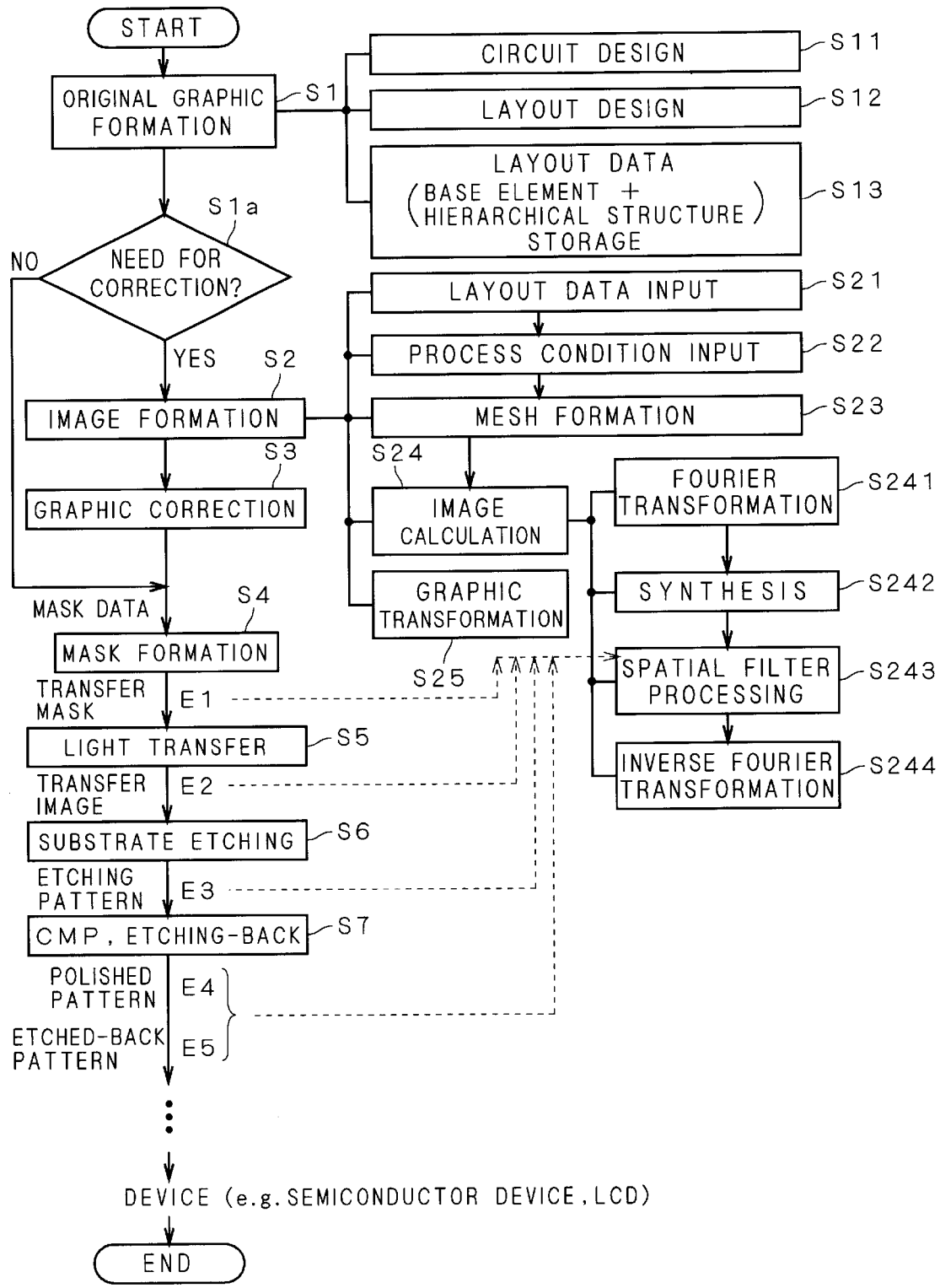
FIG. 3 is a flow chart illustrating a manufacturing process performed by the various manufacturing apparatus in FIG. 1.

FIG. 1 is a block diagram illustrating configurations of various manufacturing apparatus which perform a manufacturing process according to a first preferred embodiment, from the circuit design to product shipment of a device to be manufactured (e.g., a semiconductor device or a liquid crystal display device). FIG. 2 is a block diagram illustrating an internal configuration of an image calculation unit 42 in FIG. 1. FIG. 3 is a flow chart illustrating a manufacturing procedure performed by using the various manufacturing apparatus in FIG. 1.

Referring to FIGS. 1 to 3, an apparatus and a method according to a first preferred embodiment will be described hereinafter. Components other than the image calculation unit 42 of FIG. 1, and steps other than an image calculation step (S24) are known per se. Therefore, a full description thereof is omitted and they are presented in brief here. Although the following description will be made mainly of a case where a device to be manufactured is a semiconductor device, the present invention is not limited thereto.

When a manufacturing process of a device to be manufactured is started, a layout data expressing an original graphic is formed by an original graphic formation apparatus 30 (S1). Here, the term "original graphic" means the graphic before being subjected to a graphic correction (S3), which is compared with the graphic after graphic correction. In the original graphic formation apparatus 30, initially, based on a design condition provided from the exterior by an operator, a circuit design (S11) is performed by a circuit design unit 31. The circuit design is carried out such that a circuit to be designed can achieve a desired function and performance.

Based on the data of the circuit thus designed and the design condition from the exterior, a layout design (S12) is performed by a layout design unit 32. Specifically, there is created a layout data that defines the pattern form of a transfer mask for realizing the designed circuit on a semiconductor substrate. The created layout data is stored in a layout data storage medium 33 (S13).

In a large scale integrated circuit, a plurality of base elements are often disposed in array form within the circuit elements such as a memory cell array. By storing such a circuit layout data in the format of "base element+ hierarchical structure," the storage capacity of a storage medium can be saved to increase efficiency. Hence, the layout data of the large scale integrated circuit is stored as data to define the shape and hierarchical structure of base elements of a graphic having a hierarchical structure.

FIGS. 4A, 4B and 4C are diagrams illustrating a hierarchical structure in a layout data. In FIG. 4A, a memory 2, input/output interface 3 and logic circuit 4 are disposed in a semiconductor chip 1. In FIG. 4B, a peripheral circuit 5 and memory array 6 are disposed in the memory 2, and a plurality of memory cells 7 are disposed in matrix form in the memory array 6. In FIG. 4C, base elements 10, 11 and 12, which are graphics located at the lowermost position in the hierarchical structure, are disposed in the memory cells 7.

When no graphic correction is made (S1a), the layout data is directly used as a mask data for forming a transfer mask. In contrast, when a graphic correction is made (S1a), an image formation (S2) and a graphic correction (S3) are performed in a mask data correction apparatus 29. The image formation (S2) is performed by an image formation apparatus 40, and the graphic correction (S3) is performed by a graphic correction apparatus 50.

In the image formation (S2), initially the layout data having a hierarchical structure is inputted from the layout data storage medium 33 (S21), a process condition (i.e., condition related to a manufacturing process) is inputted from the exterior (S22). The process condition defines, for example, a drawing method of a transfer mask (e.g., electron beam drawing, laser drawing, the type of a low-reflection mask, and the type of a phase shift method), the optical parameters of an exposure apparatus (e.g., wavelength, numerical aperture, numerical aperture ratio σ, and the type of super-resolution), the condition related to a resist (e.g., pre bake, PEB, negative/positive, novolak type, chemically amplified type, and dry/wet development), and an etching condition (e.g., dry/wet).

Then, by a mesh formation unit 41, an image forming region (i.e., a region calculated for evaluation) is set in real space and Fourier space, and meshes are set in the image forming region (S23). Specifically, a memory region that corresponds to the image forming region of the real space and a memory region that corresponds to the image forming region of the Fourier space are allocated in a storage medium (not shown).

An image calculation is performed by an image calculation unit 42 (S24). In the image calculation (S24), initially the base elements defined by the layout data are subjected to Fourier transformation in a Fourier transformation part 421 (see FIG. 2), thereby to obtain Fourier images of the base elements. In a synthesizing part 422, the Fourier images of the base elements are superimposed in the Fourier space, based on the hierarchical structure defined by the layout data, thereby to obtain the Fourier image of the entire graphic of the image forming region (S242).

A spatial filter part 423 subjects the Fourier image of the entire graphic to spatial filter processing that corresponds to distortion estimated in the manufacturing process. The distortion is estimated based on the process condition. As will hereinafter be fully described in a second preferred embodiment, various distortions E1 to E5 take place in the respective steps of the manufacturing process. The operator can instruct from the exterior which one of these distortions is to be reflected, as shown in FIG. 1.

The spatial filter processing corresponding to various distortions is known per se. For instance, when taking the influence of the numerical aperture of an optical system into consideration, a circular low pass filter processing is preferably performed. When taking directional dependency in the manufacturing apparatus characteristics into consideration, an elliptic filter processing is preferably performed.

Subsequently, an inverse Fourier transformation part 424 subjects the Fourier image after spatial filter processing to inverse Fourier transformation, thereby to obtain the inverse Fourier image reflecting the distortion. That is, the inverse Fourier image reflecting the distortion is outputted from the image calculation unit 42.

Figure 6:
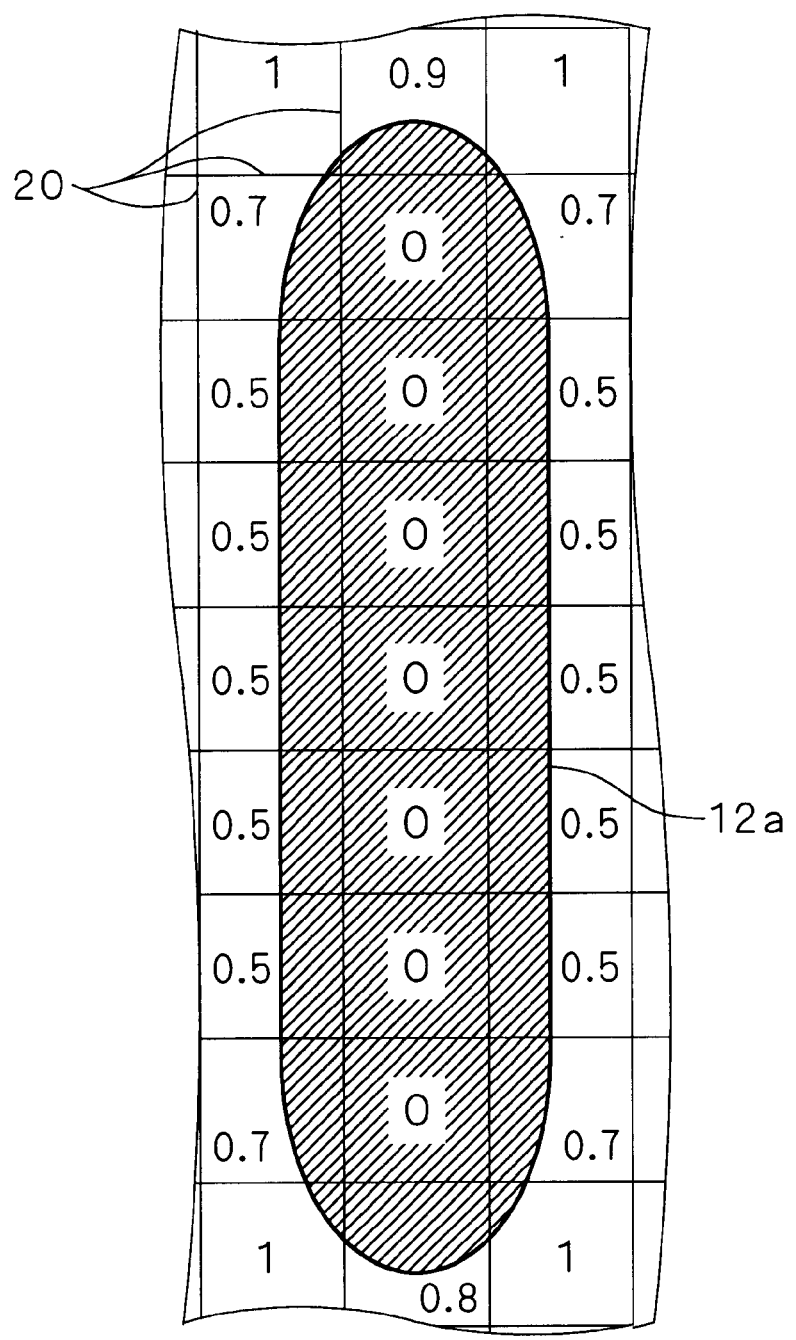

FIGS. 5A, 5B and 6 are explanatory diagrams illustrating the operations of the mesh formation unit 41 and image calculation unit 42, as described above. In the example illustrated in FIGS. 5A and 5B, an image forming region L is set in the memory 2 illustrated in FIGS. 4A, 4B and 4C. Meshes 20 formed by the mesh formation unit 41 are set in the image forming region L in the real space, as illustrated in FIG. 5A. When no spatial filter processing is performed, that is, when no distortion is reflected, the inverse Fourier image outputted from the image calculation unit 42 is, for example, as illustrated in FIG. 5B. In FIG. 5B there is shown the inverse Fourier image of the base element 12 drawn in FIG. 4C.

The base elements 10, 11 and 12 illustrated in FIG. 4C are described as a graphic data in the layout data. In the graphic data, the shapes of the base elements 10, 11 and 12 are each described in a set of coordinate values of their respective angles, for example. On the other hand, the Fourier transformation part 421 forms, as is well known in the art, a Fourier image as an image data on meshes set in Fourier space.

The inverse Fourier transformation part 424 forms the inverse Fourier image as an image data on the meshes 20 set in the real space, as illustrated in FIG. 5B. FIG. 5B illustrates the numeric values of the image data per cell of the meshes 20. In the example of FIG. 5B, the numeric value of 0 is given to the cell where the base element 12 is present, and the numeric value of 1 is given to the cell where no base element 12 is present. That is, the numeric value in the range of 0 to 1 is given depending on the ratio of presence.

Since no distortion is reflected in the example of FIG. 5B, the shape of the base element 12 represented by the inverse Fourier image is the same as the base element 12 represented by the layout data (see FIG. 4C). In contrast, when a spatial filter processing is performed, that is, when distortion is reflected, the inverse Fourier image outputted from the image calculation unit 42 is, for example, as illustrated in FIG. 6.

Returning to FIGS. 1, 2 and 3, the inverse Fourier image, which is an image data outputted from the image calculation unit 42, is transformed into the format for graphic data similar to that of the layout data by a graphic transformation unit 43 (S25). In a graphic correction apparatus 50, the graphic outputted from the graphic transformation unit 43 is compared with the graphic defined by the layout data, thereby the latter is corrected in such a direction as to suppress distortion and then outputted as a mask data (S3).

Figure 7:
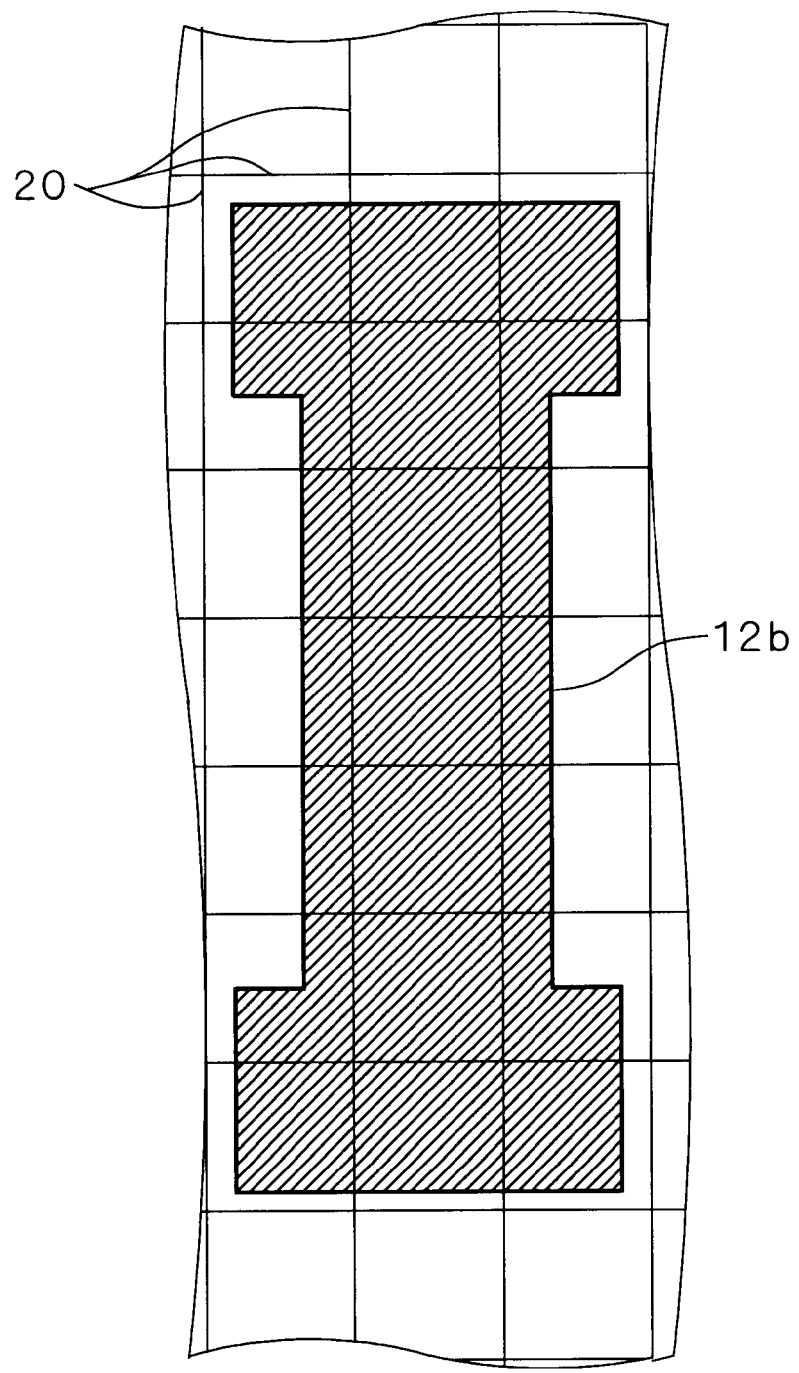
FIG. 7 is an explanatory diagram of the operation of a graphic correction apparatus.

For instance, improvements in the overall process margin can be attained in the following manner that under sizing is performed for the portion that is expected to be finished in a large size based on the result of calculation in the image calculation unit 42, whereas over sizing is performed for the portion that is expected to be finished in a small size. FIG. 7 is a diagram illustrating the shape of a base element 12b after correction. As to the example of FIG. 7, the shape of the base element 12 having no distortion is as illustrated in FIG. 5B, and the shape of the base element 12b when distortion is taken into consideration is as illustrated in FIG. 6. Therefore, in order to suppress or eliminate distortion, a graphic correction is performed as shown in FIG. 7. Since the configuration and operation of the graphic correction apparatus 50 is fully disclosed in literature I and are known techniques, a detailed description thereof is thus omitted.

A mask formation apparatus 61 forms a transfer mask based on a mask data outputted from the graphic correction apparatus 50 (S4). A light transfer apparatus 62 transfers the transfer mask to a resist formed on the surface of a semiconductor substrate which is a material of the semiconductor device (S5). As is well known in the art, the resulting resist is patterned in the transferred pattern form. A substrate etching apparatus 63 performs selective etching of the semiconductor substrate by using the patterned resist as a shield (S6). A CMP apparatus and an etch back apparatus 64 perform respectively CMP (chemical mechanical polishing) and etch back processing of a film deposited on the semiconductor substrate after having been selectively etched (S7). After passing through the foregoing various processes, the semiconductor device is completed as a product.

Thus, in the mask data correction apparatus 29 of the first preferred embodiment, the Fourier image of the entire graphic is obtained by synthesizing the Fourier images of their respective base elements, based on the hierarchical structure. Therefore, correction for a mask data in which a large number of base elements are contained in a graphic can be attained at high efficiency while maintaining accuracy.

Second Preferred Embodiment

A second preferred embodiment discusses various distortions in a manufacturing process which are reflected on the image calculation unit 42. As one particular example, the case that a device to be manufactured is a semiconductor device will be described hereinafter. Note that even in a manufacturing process for other devices such as a liquid crystal display device, similar distortions can be assumed and reflected on the image calculation unit 42. A technique of reflecting these distortions on the spatial filter part 423, and a technique of suppressing these distortions in the graphic correction apparatus 50 are well known per se.

Figure 8:
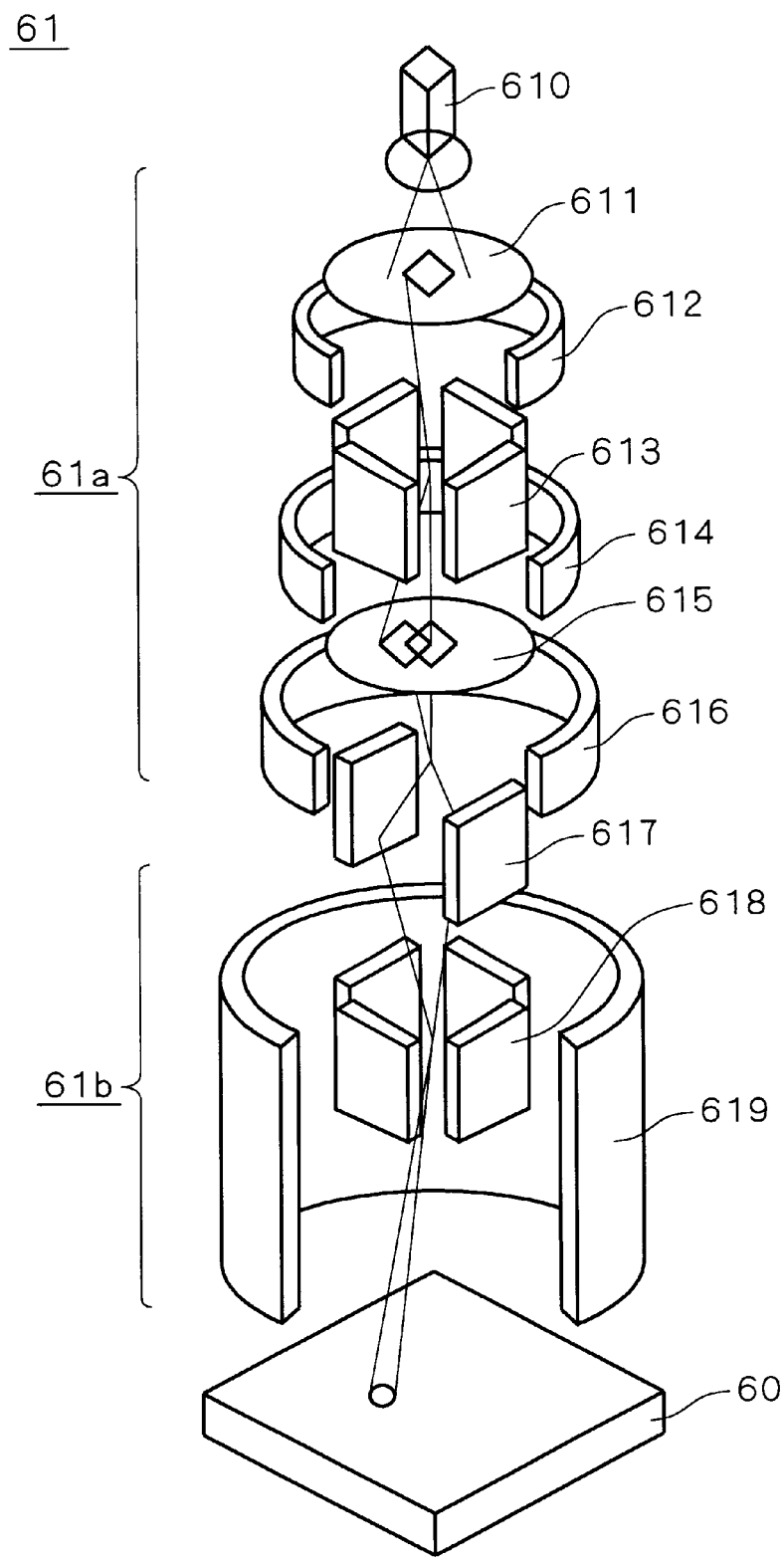
FIG. 8 is a perspective view, partially broken away, a configuration of a mask formation apparatus.

FIG. 8 is a perspective view, partially broken away, illustrating a known configuration of the mask formation apparatus 61. An electron beam generated by an LaB6 electron gun 610 passes through a first shaping aperture 611, first shaping lens 612, first shaping deflector 613, second shaping lens 614, second shaping aperture 615, demagnification lens 616 and blanking electrode 617, all of which constitute a variable shaped lens part 61a. The electron beam then passes through a deflector 618 and demagnification lens 619 which constitute a converging and deflecting lens part 61b, and is converged at a single point on a transfer mask 60. Based on the mask data inputted to the mask formation apparatus 61, a graphic represented by the mask data is drawn on the transfer mask 60.

At this time, between the graphic represented by the mask data and the graphic drawn on the transfer mask 60, a drawing distortion E1 (see FIG. 3) occurs. The graphic drawn on the transfer mask 60 corresponds to a distribution image of the stored energy of the electron beam. When a laser beam is employed in place of the electron beam, a graphic to be drawn corresponds to a distribution image of the stored energy of the laser beam. The mask data correction apparatus 29 can perform proximity correction by using the distribution image of such stored energy, thereby suppressing or canceling the drawing distortion E1.

Figure 9:
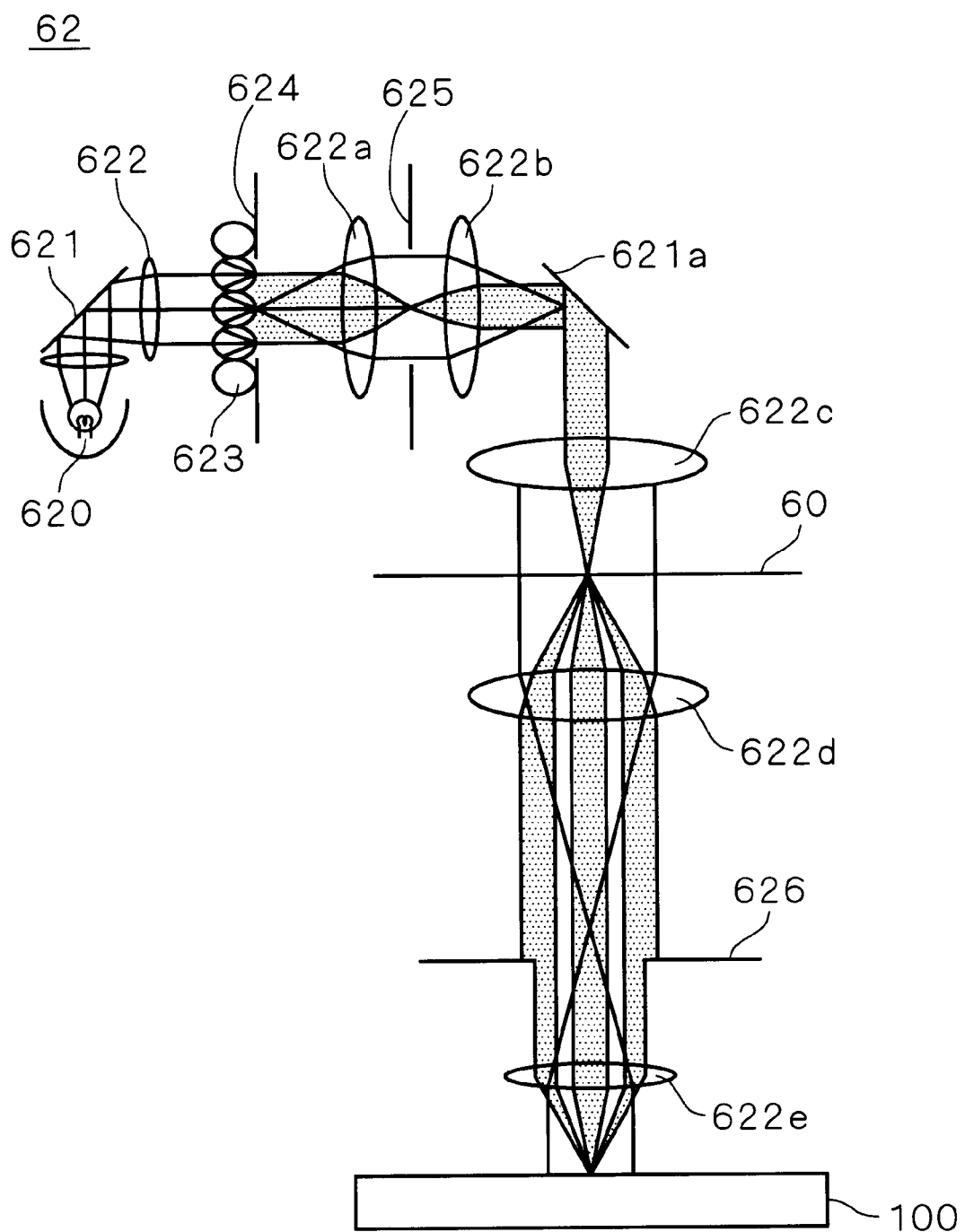
FIG. 9 is an explanatory diagram illustrating a configuration of a light transfer apparatus.

FIG. 9 is an explanatory diagram illustrating a known configuration of the light transfer apparatus 62. In the present specification, "light" used in transfer of the transfer mask will represent widely electromagnetic wave, e.g., ultraviolet light is included therein. Light generated at a lamp 620 passes through a mirror 621, lens 622, fly eye 623, lens 622a, secondary light source plate 625, lens 622b, mirror 621a, lens 622c, transfer mask 60, lens 622d, pupil surface 626 and lens 622e, and the light is then irradiated on the surface of a semiconductor substrate (semiconductor wafer) 100. Thereby, the graphic of the transfer mask 60 is transferred to the surface of the semiconductor substrate 100. At this time, between the graphic drawn on the transfer mask 60 and the transfer image on the surface of the semiconductor substrate 100, a transfer distortion E2 (see FIG. 3) occurs. The mask data correction apparatus 29 can perform a light proximity correction by using an optical image, thereby suppressing or canceling the transfer distortion E2.

Figure 10A:
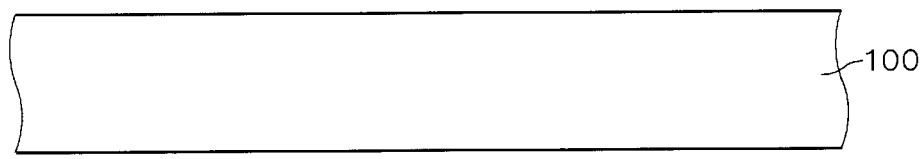
FIGS. 10A to 10F are diagrams illustrating a sequence of steps in a method of manufacturing a semiconductor device.
Figure 10B:
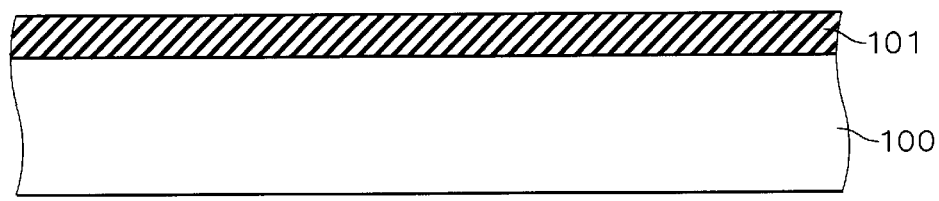
Figure 10C:
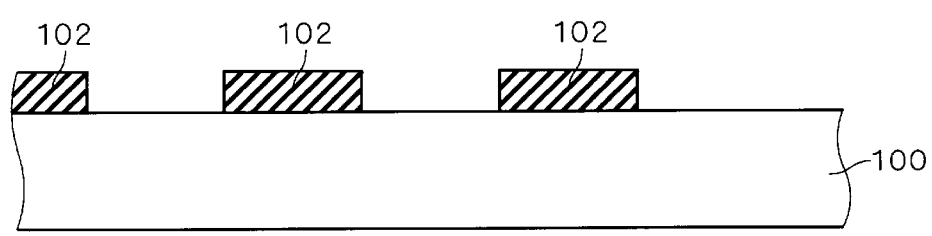

FIGS. 10A to 10F are diagrams illustrating a sequence of steps in a method of manufacturing a semiconductor device. In this manufacturing process, initially a semiconductor substrate 100 is provided (FIG. 10A), and a resist 101 is applied on the main surface of the semiconductor substrate 100 (FIG. 10B). Subsequently, by using the light transfer apparatus 62, the graphic of a transfer mask is transferred to the resist 101, followed by development, resulting in a resist pattern 102 (FIG. 10C).

Figure 10D:
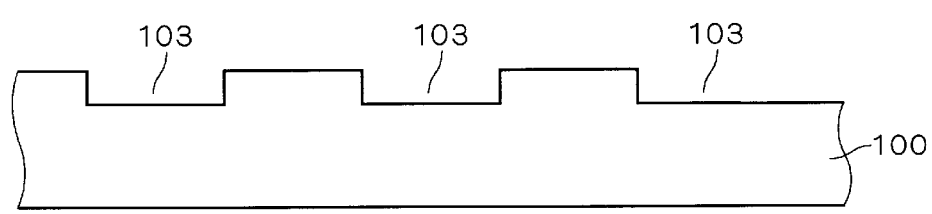

By using the resist pattern 102 as a shield, the main surface of the semiconductor substrate 100 is subjected to selective etching (FIG. 10D). An etching distortion E3 resulting from the transfer image (see FIG. 3) occurs on the obtained etching pattern. The mask data correction apparatus 29 can perform proximity correction by using a microloading effect image in the etching, thereby suppressing or canceling the etching distortion E3.

Figure 10E:
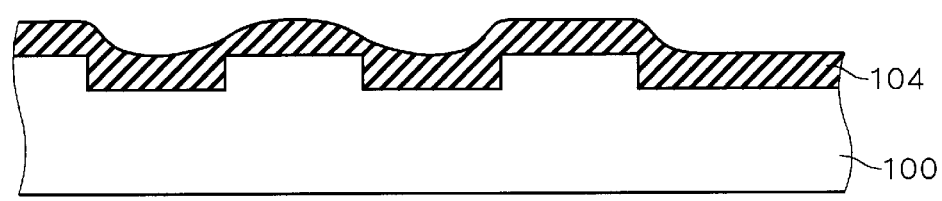
Figure 10F:
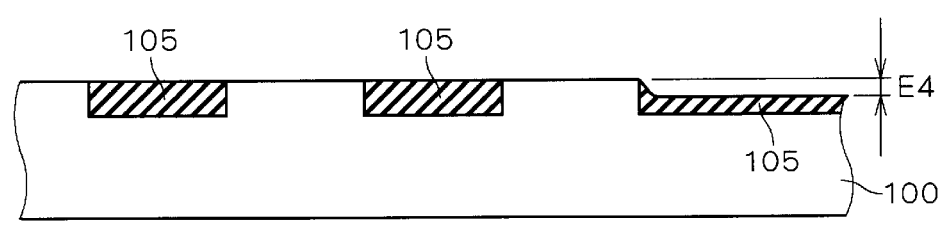

Subsequently, isotropic deposition is performed to deposit a film 104 so as to cover the etched semiconductor substrate 100 (FIG. 10E). Irregularities corresponding to the etching pattern are formed on the surface of the film 104, as shown in FIG. 10E. Then, the film 104 is polished by CMP, until the main surface of the semiconductor substrate 100 is exposed (FIG. 10F).

Figure 11:
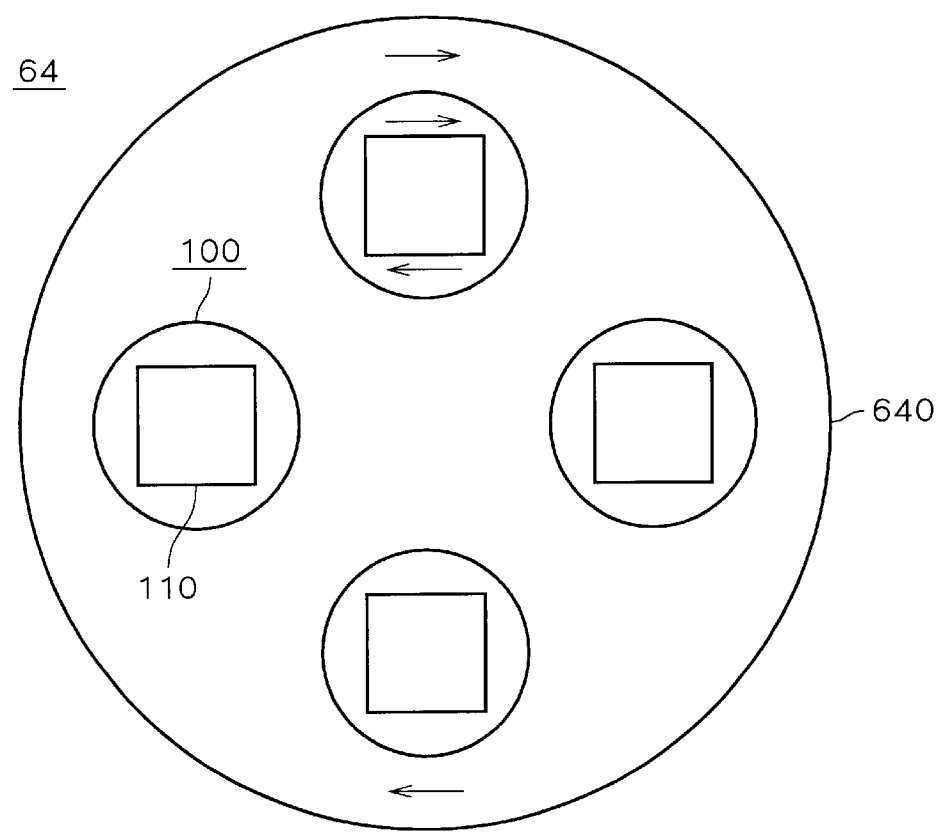
FIG. 11 is a plan view illustrating a configuration of a CMP apparatus.

FIG. 11 is a plan view illustrating a known configuration of the CMP apparatus 64 for performing CMP. The semiconductor substrates 100 are mounted on a rotating table 640, and each semiconductor substrate 100 rotates on its axis on the table 640. In FIG. 11, chip formation region 110 of the semiconductor substrates 100 are drawn in rectangle. A polishing cloth (not shown) is attached to a location above the table 640, and the polishing cloth is pressed against each of the main surface of the semiconductor substrates 100. Through two rotational modes of the revolution of the table 640 and the spinning of the semiconductor substrates 100, each main surface of the semiconductor substrates 100 is polished by means of the mechanical friction with the polishing cloth, and the chemical action of chemicals.

Returning to FIG. 10F, if unevenness is present in the etching pattern density, a polishing distortion E4 occurs on a film 105 having a polishing pattern, along a normal of the main surface of the semiconductor substrate 100. The mask data correction apparatus 29 can perform CMP correction by using the polishing image, thereby suppressing or canceling the polishing distortion E4.

Figure 12:
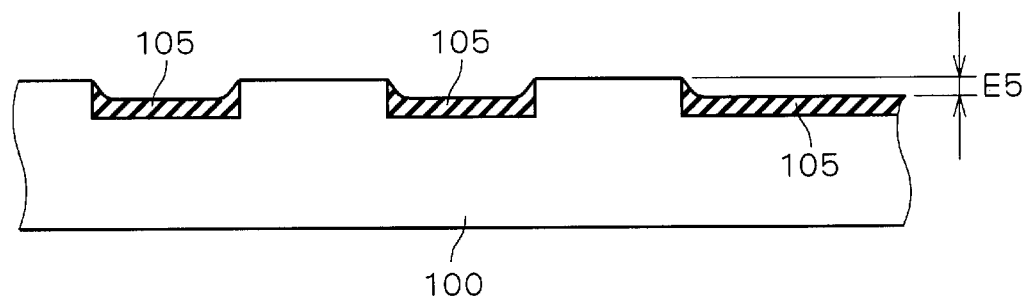
FIG. 12 is a diagram illustrating one step in a method of manufacturing a semiconductor device.

FIG. 12 is a diagram illustrating the step of performing, after the step of FIG. 10E, an etch back processing instead of the CMP. This step causes an etch back distortion E5 on the etch back pattern of the film 105, along a normal of the main surface of the semiconductor substrate 100. The mask data correction apparatus 29 can make correction by using the etch back image, thereby suppressing or canceling the etch back distortion E5.

Third Preferred Embodiment

FIG. 13 is a block diagram illustrating a preferred internal configuration of the Fourier transformation part 421. FIG. 14 is a flow chart illustrating a preferred internal flow of Fourier transformation (S241) performed by the Fourier transformation part 421. The Fourier transformation part 421 shown in FIG. 13 comprises a graphic dividing part 4211 and an element graphic Fourier transformation unit 4212. The graphic dividing part 4211 comprises a triangle dividing part 4213, tetragon dividing part 4214 and circle dividing part 4215. A layout data is inputted to these dividing parts 4213, 4214 and 4215.

When the Fourier transformation (S241) is started, the triangle dividing part 4213 divides a base element defined by the layout data, into one or more triangles (S2411). For instance, with respect to a base element 10 shown in FIG. 15, a right triangle 10a is separated from the base element 10, as shown in FIG. 16, and a right angle polygon 10b is thus left.

The tetragon dividing part 4214 divides a base element into one or more tetragons (S2412). For instance, tetragons 10c and 10d shown in FIG. 17 are separated from the right angle polygon 10b in FIG. 16. Accordingly, any base element, no matter how complex polygon it is, can be divided into an aggregation of simple triangles and tetragons.

When the base element defined by the layout data also includes a circle, the circle portion is further separated by the circle dividing part 4215 (S2413). In this manner, the base element is divided into an aggregation of element graphics which are in the form of a triangle, tetragon or circle.

In the element graphic Fourier transformation unit 4212, Fourier transformation is performed per element graphic in the group made up of element graphics thus divided, thereby to obtain their respective Fourier images (S2414). Since triangle, tetragon and circle are each simple shape, the element graphic Fourier transformation unit 4212 can perform Fourier transformation easily and rapidly through a simple calculation. The element graphics' Fourier images obtained in the element graphic Fourier transformation unit 4212 are synthesized into a graphic Fourier image of the entire image forming region by the synthesizing part 423 (see FIG. 2).

Thus, according to the third preferred embodiment, the Fourier image relative to the graphic of the entire image forming region is obtained by dividing the base element into the group of element graphics, each being a triangle, tetragon or circle; performing Fourier transformation per element graphic; and superimposing the results thus obtained. Therefore, even if the base element has any complicated shape, Fourier transformation to the graphic of the entire image forming region can be achieved in short time without degradation of accuracy. No approximation calculation is contained in Fourier transformation, and it is thus able to obtain the exact Fourier image that is not approximation.

Further, in addition to application to the mask data correction apparatus 29, the Fourier transformation part 421 of the third preferred embodiment can also be applied to a variety of fields by combining with the synthesizing part 423, as Fourier transformation apparatus by which the Fourier image relative to generally complicate graphics can be obtained easily and rapidly.

Fourth Preferred Embodiment

Figure 19:
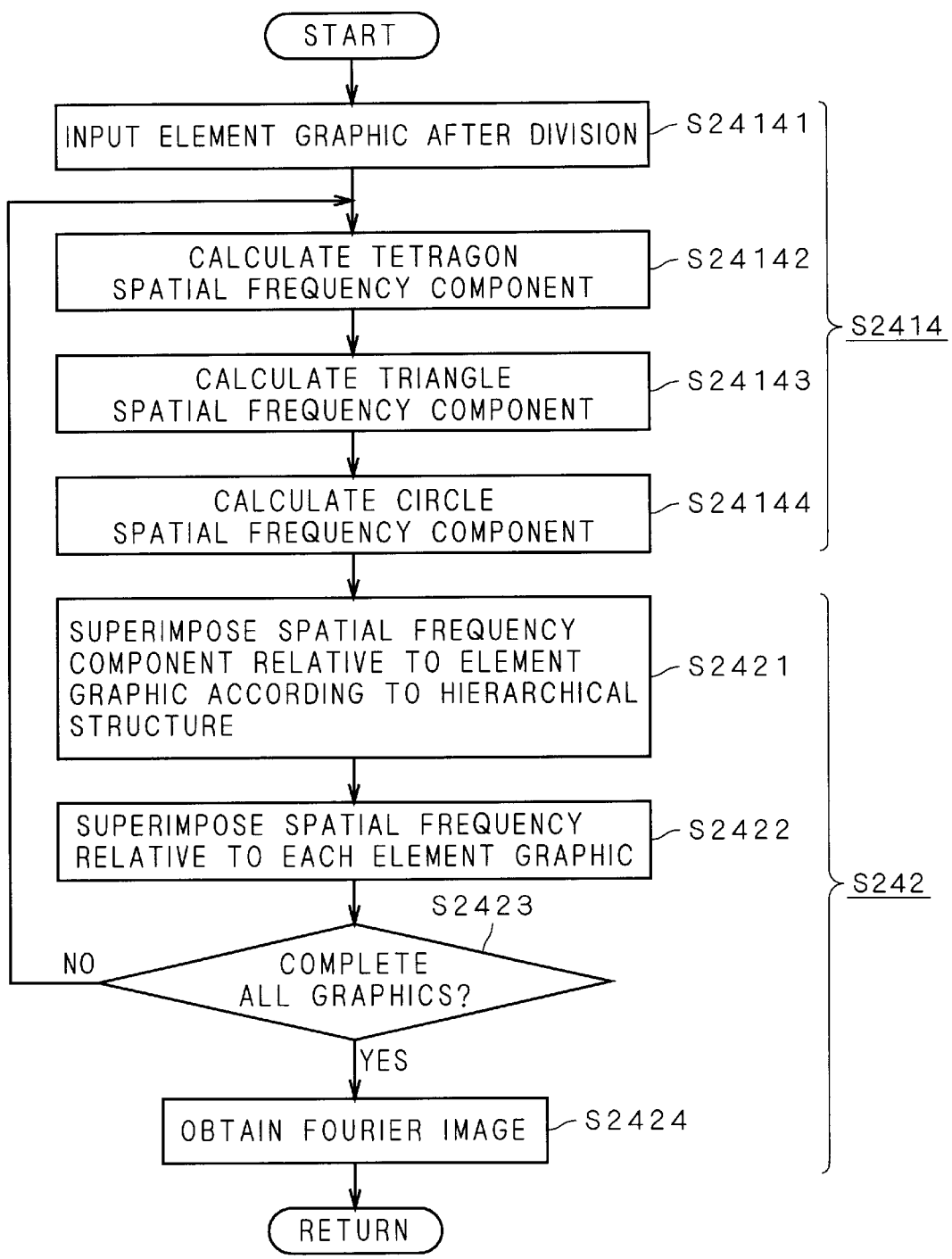
FIG. 19 is a flow chart illustrating the process performed by the element graphic Fourier transformation part and the synthesizing part.

FIG. 18 is a block diagram illustrating a preferred internal configuration of the element graphic Fourier transformation unit 4212 and synthesizing part 422. FIG. 19 is a flow chart illustrating a preferred internal flow of the processing (S2414) by the element graphic Fourier transformation unit 4212 and the processing (S242) by the synthesizing part 422. The element graphic Fourier transformation unit 4212 comprises three spatial frequency component calculating parts 42121, 42122 and 42123 which calculate the corresponding element graphic shape. An element graphic data outputted from the graphic dividing part 4211 (see FIG. 13) is inputted to these calculating parts 42121, 4212 and 42123. The synthesizing part 422 comprises first and second synthesizing parts 4221 and 4222.

When an element graphic data is inputted to the element graphic Fourier transformation unit 4212 (S24141), the three spatial frequency component calculating parts 42121, 42122 and 42123 perform Fourier transformation of triangle, tetragon and circle in the element graphic, respectively, thereby to obtain their respective Fourier images (i.e., a set of spatial frequency components) (S24142, S24143, S24144). Each spatial frequency component can be obtained by performing Fourier integration along x and y directions in the real space.

The first synthesizing part 4221 superimposes the Fourier images per element graphic, according to the hierarchical structure (S2421). Thereby, the Fourier image relative to the element graphic of the entire image forming region can be obtained per element graphic. The second synthesizing part 4222 superimposes the Fourier images per element graphic obtained in the first synthesizing part 4221 (S2422). If the processing to the graphic of the entire image forming region is not completed (S2422), the procedure returns to step S24142. If completed (S2423), the Fourier image relative to the graphic of the entire image forming region is obtained (S2424).

In the foregoing procedure, the set of spatial frequency components calculated by Fourier integration for element graphic is repetitively used according to the hierarchical structure. Therefore, the number of Fourier integrations and the number of operations of trigonometric function are reduced considerably, and the processing capacity of Fourier transformation is increased significantly. Even a large scale of data can be processed in a practical calculation time. In addition, the accuracy of calculation is high because such hierarchical processing contains no approximation and is the exact calculation. It has been confirmed that the obtained result was perfectly the same as that obtained in the case that Fourier integration of each graphic is performed after the hierarchical structure is expanded. Also, it has been verified that there was no degradation of the accuracy of calculation.

A conventional technique of superimposing in real space suffers from the following drawbacks: (i) forward or backward scattering of electron beam; (ii) optical interference effect; (iii) microloading effect; and (iv) difficulties in accurately introducing deformation effect of a polishing cloth, etc., all of which have a long correlation distance. Whereas in the foregoing preferred embodiments, superimposing is conducted in Fourier space and it is thus easy to reflect accurately these effects having a long correlation distance.

Fifth Preferred Embodiment

When the element graphic Fourier transformation unit 4212 of the third or fourth preferred embodiment calculates the spatial frequency components of an element graphic, it is able to employ such a usual manner in Fourier transformation that numerical integration is performed after the element graphic is expanded in a bit map. Preferably, by the effective use of the fact that the graphic to be subjected to Fourier transformation is a simple triangle, tetragon or circle, it is able to employ such a manner of calculating analytically definite integral by finding a primitive function $F(x)$ of Fourier integral from the following equation (1):

$$\int_a^b f(x)dx = [F(x)]_a^b \qquad (1)$$

Thereby, fast calculation is achievable while increasing accuracy of Fourier transformation.

Sixth Preferred Embodiment

Figure 20:
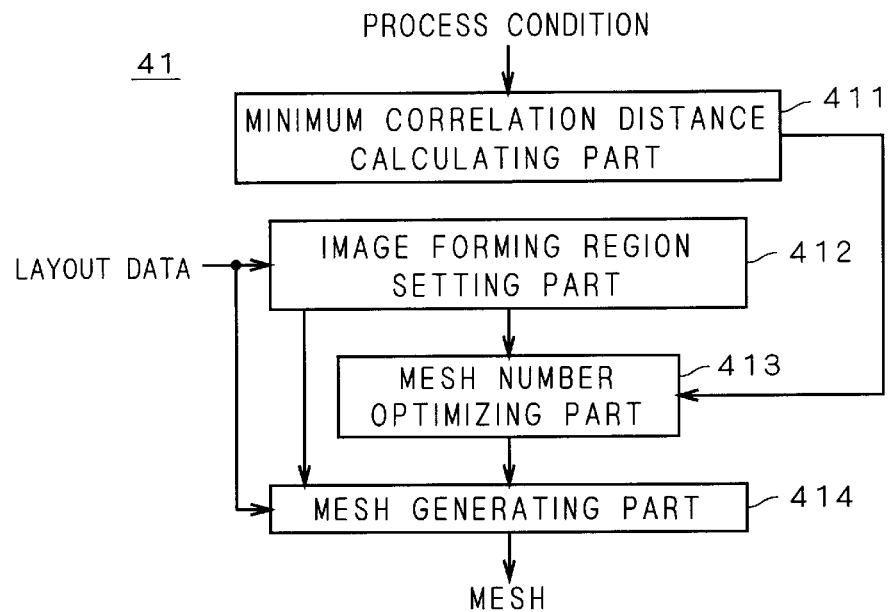
FIG. 20 is a block diagram illustrating an internal configuration of a mesh formation unit.
Figure 21:
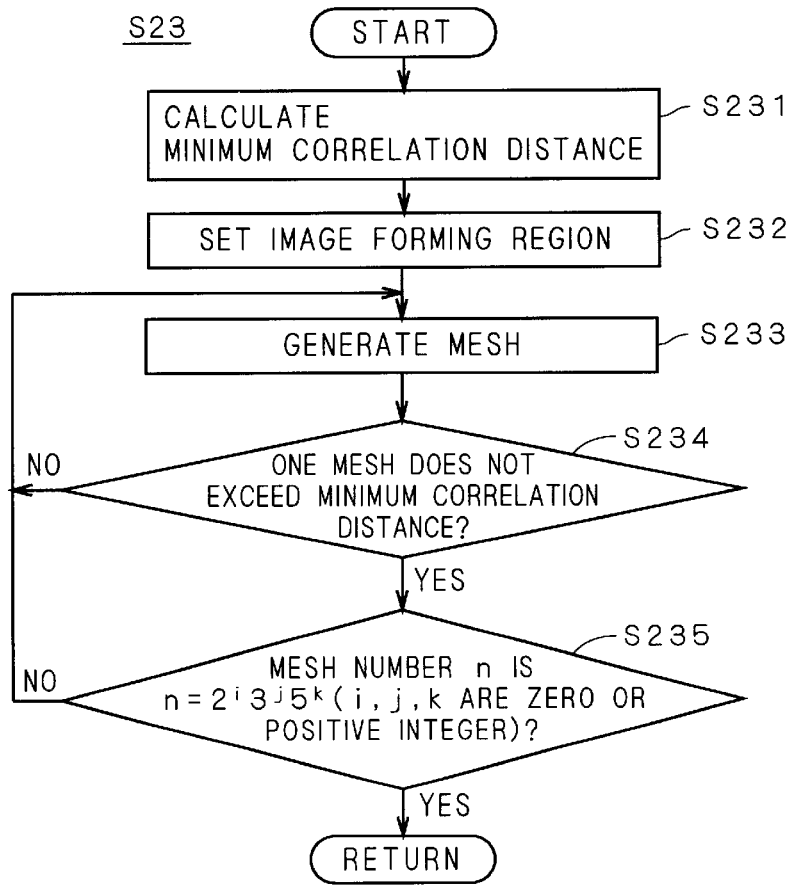
FIG. 21 is a flow chart illustrating the process performed by the mesh formation unit.

FIG. 20 is a block diagram illustrating a preferred internal configuration of the mesh formation unit 41. FIG. 21 is a flow chart illustrating a preferred internal flow of the mesh formation (S23) by the mesh formation unit 41. When the mesh formation (S23) by the mesh formation unit 41 shown in FIG. 20 is started, a minimum correlation distance calculating part 411 calculates a minimum correlation distance in the manufacturing process, based on the manufacturing process condition (S231). For instance, in the case of an optical system, the minimum correlation distance corresponds to a minimum resolution R, and R is given by $R=\lambda/4NA$, wherein $\lambda$ is the wavelength of exposure light, and NA is the numerical aperture of a projection lens.

Subsequently, an image forming region L (see FIG. 5A) is set by the image forming region setting part 412 (S232). An optimum number of meshes is determined by a mesh number optimizing part 413. Specifically, as an optimum number of meshes, the number of meshes along two directions crossing in the image forming region is determined such that the mesh width is the largest in the range not exceeding the minimum correlation distance, and the number of meshes is a positive integer. More preferably, it is determined such that the mesh width is the largest in the range not exceeding the minimum correlation distance, and the number of meshes n is defined by $n=2^i 3^j 5^k$ (i, j and k are each zero or a positive integer) (S234, S235). The latter manner enables to utilize fast Fourier transformation (FFT), which can be used with a multiple of 2, 3 or 5.

As a specific case of the above-mentioned condition, in order to meet $n=2^i$ (i is a positive integer), an initial dividing number n0 is determined so as to meet the following equation (2):

$$n0 = ceil(L/R) \qquad (2)$$

wherein ceil is a round-up integer making function.

Then, when the number of meshes n is determined by the following equation (3):

$$n = 2^{ceil(\log n/\log 2)} \qquad (3)$$

the number of meshes n becomes an exponentiation of 2. This is also advantageous in utilizing fast Fourier transformation (FFT).

The mesh generating part 414 generates meshes according to the number of meshes determined by the mesh number optimizing part 413 (S233).

Thus, in the sixth preferred embodiment, minimum number of meshes can be set and it is thus able to omit the wasteful calculation of forming the number of meshes than necessary, from the point of view of accuracy of calculation. This enables to attain fast processing while maintaining high accuracy of calculation.

Seventh Preferred Embodiment

Figure 22:
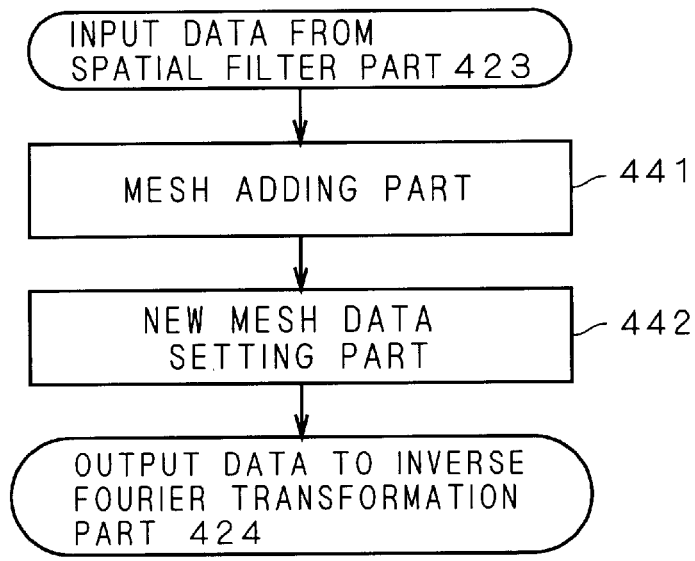
FIG. 22 is a block diagram illustrating an internal configuration of an up sampling unit.
Figure 23:
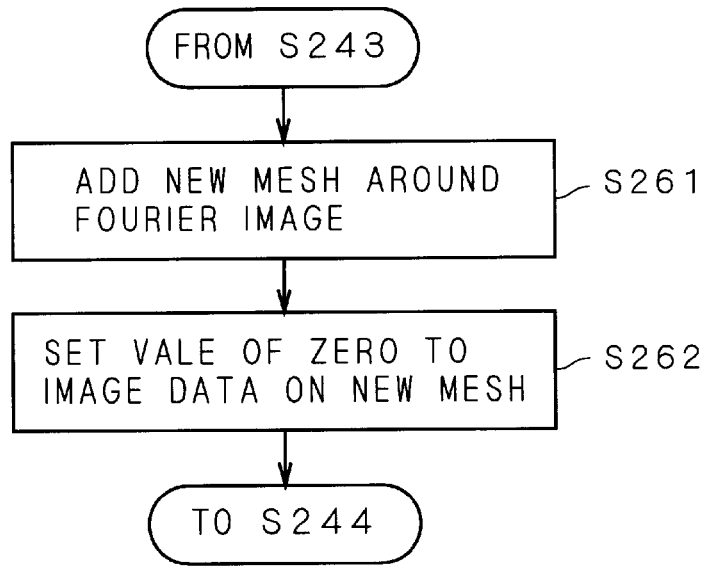
FIG. 23 is a flow chart illustrating the process performed by the up sampling unit.

When, by using minimum number of meshes for accuracy of calculation according to the sixth preferred embodiment, calculation is performed and the result is displayed, it is rough to the eye of the viewer in some cases. In this event, it is recommended to perform up sampling. FIG. 22 is a block diagram illustrating an internal configuration of an up sampling unit 44, which is interposed for the up sampling between the spatial filter part 423 and inverse Fourier transformation part 424 in FIG. 2. The up sampling unit 44 comprises a mesh adding part 441 and new mesh data setting part 442. FIG. 23 is a flow chart illustrating a procedure performed by the up sampling unit 44.

The mesh adding part 441 adds a new mesh to an image data inputted from the spatial filter part 423 (S261). The new mesh data setting part 442 sets the value of zero to the image data on the added mesh, and outputs the result together with the image data before the mesh is added, to the inverse Fourier transformation part 424 (S262).

Figure 24A:
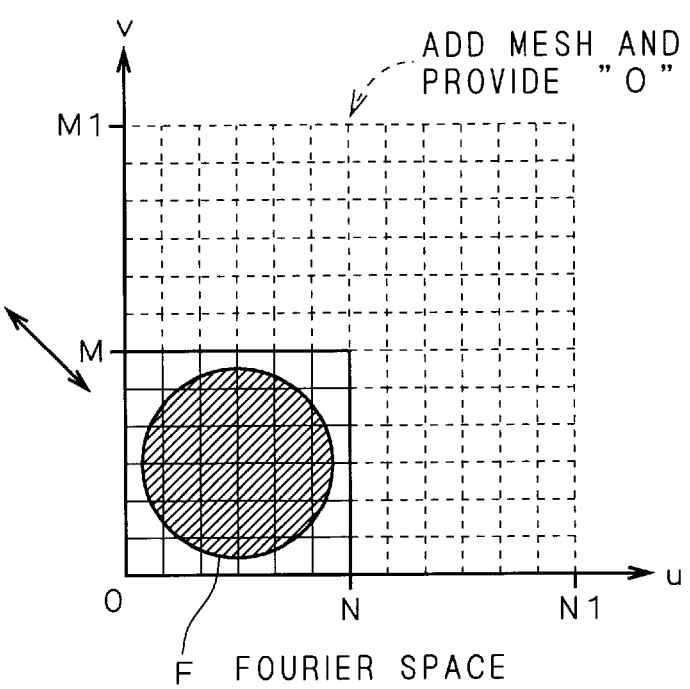
FIGS. 24A–24C are operational diagrams illustrating the process performed by the up sampling unit.
Figure 24B:
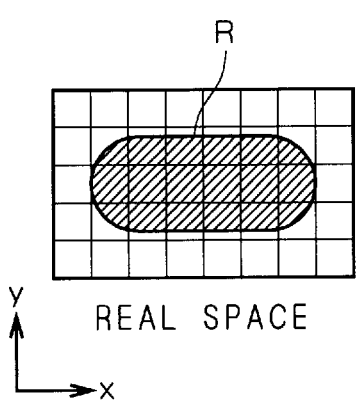
Figure 24C:
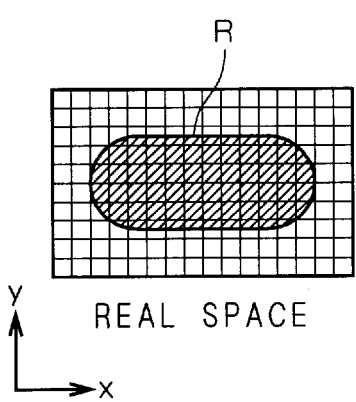

FIGS. 24A, 24B and 24C are explanatory diagrams illustrating processes performed by the mesh adding part 441 and new mesh data setting part 442. Fourier image F in Fourier space (see FIG. 24A) is transformed into the inverse Fourier image R in the real space, by inverse Fourier transformation in the inverse Fourier transformation part 424 (see FIG. 24B). In contrast, when a mesh is added in Fourier space and the value of zero is provided to the image data on the added mesh (see FIG. 24A), its inverse image R becomes finer than the image of FIG. 24B, as shown in FIG. 24C.

For instance, in the case that new meshes are added in Fourier space and the number of meshes is increased to 2×2 times in two dimensions, up sampling to 2×2 times meshes in two dimensions is completed at the time the inverse Fourier transformation toward the real space is performed. In general, the ratio of increasing the number of meshes may be set arbitrarily. It is however desirable to set such a ratio at which it is able to utilize FFT, e.g., 2×2 times.

Thus, according to the seventh preferred embodiment, up sampling can be performed in Fourier space with each interpolated point reflecting the entire image. This realizes interpolation smoother and more natural than mere linear interpolation, thus providing the advantage that the accuracy of interpolation is high.

Eighth Preferred Embodiment

Figure 25:
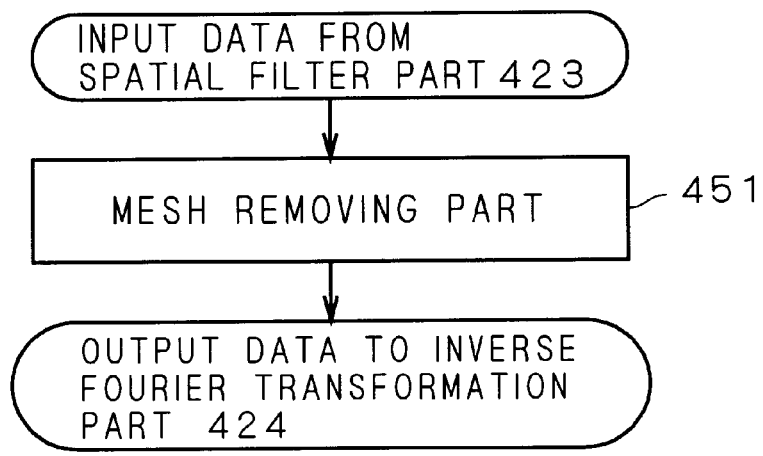
FIG. 25 is a block diagram illustrating an internal configuration of a down sampling unit.
Figure 26:
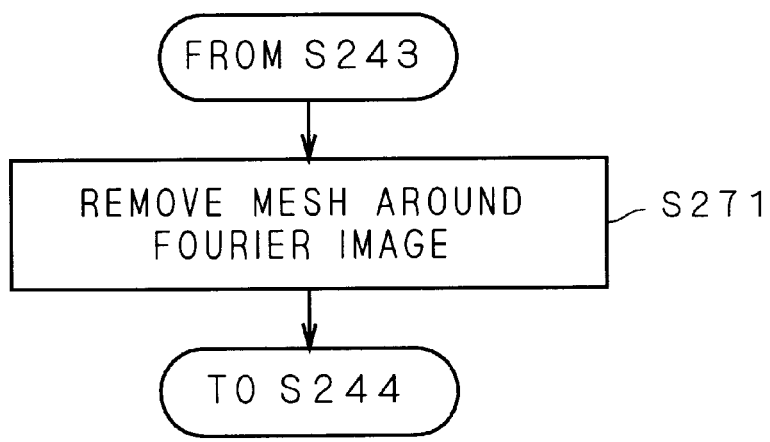
FIG. 26 is a flow chart illustrating the process performed by the down sampling unit.

On the contrary to the seventh preferred embodiment, in the case that the number of meshes to be calculated is larger than the number of meshes of a display device, by performing down sampling, the speed of display can be increased without degradation of image quality. FIG. 25 is a block diagram illustrating an internal configuration of a down sampling unit 45 for achieving the above purpose, which is interposed between the spatial filter part 423 and inverse Fourier transformation part 424 in FIG. 2. The down sampling unit 45 comprises a mesh removing part 451. FIG. 26 is a flow chart illustrating a procedure performed by the down sampling unit 45.

The mesh removing part 451 removes some of meshes from an image data inputted from the spatial filter part 423 (S271). The resulting image data is outputted to the inverse Fourier transformation part 424.

Figure 27B:
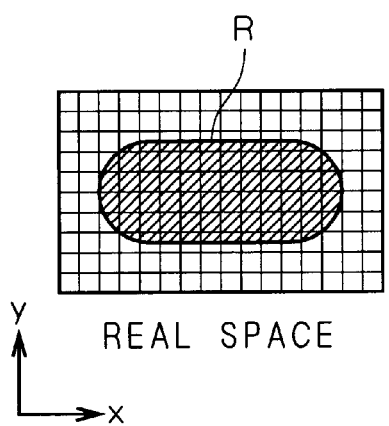
FIGS. 27A to 27C are operational diagrams illustrating the process performed by the down sampling unit.
Figure 27A:
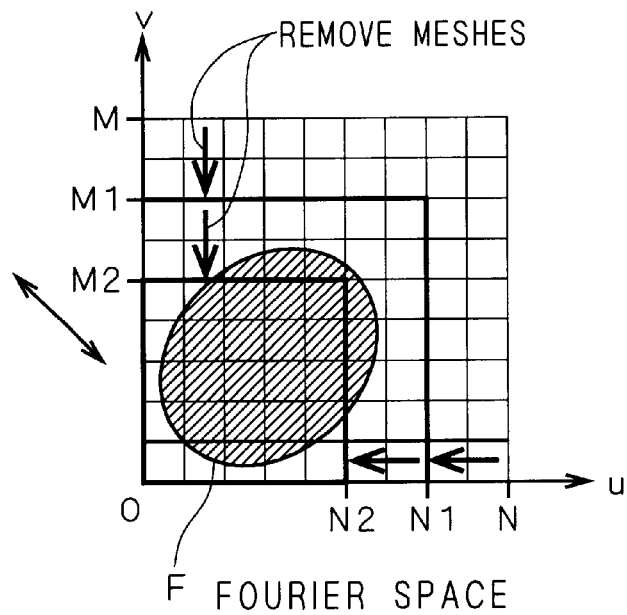
Figure 27C:
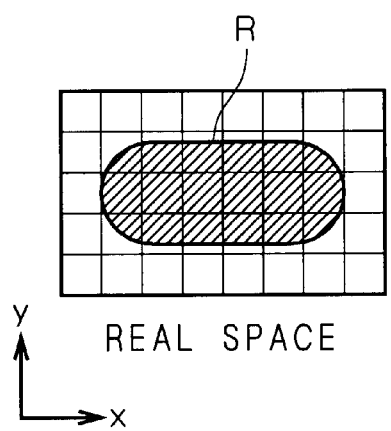

FIGS. 27A, 27B and 27C are explanatory diagrams illustrating processes performed by the mesh removing part 451. Fourier image F in Fourier space (see FIG. 27A) is transformed into the inverse Fourier image R in the real space, by inverse Fourier transformation in the inverse Fourier transformation part 424 (see FIG. 27B). In contrast, when some of meshes are removed in Fourier space (see FIG. 27A), its inverse image R becomes rougher than the image of FIG. 27B, as shown in FIG. 27C.

For instance, in the case that high frequency components around the Fourier image F in the Fourier space and the number of meshes is reduced to ½×½ times in two dimensions, down sampling to ½×½ times meshes in two dimensions is completed at the time the inverse Fourier transformation in the real space is performed. In general, the ratio of reducing the number of meshes may be set arbitrarily. It is however desirable to set such a ratio at which it is able to utilize FFT, e.g., ½×½ times.

Thus, according to the eighth preferred embodiment, down sampling can be performed in Fourier space with each interpolated point reflecting the entire image. This realizes interpolation smoother and more natural than mere linear interpolation. In addition, the speed of display of the result of calculation is increased to improve the apparatus operability.

Ninth Preferred Embodiment

A transfer mask of inexpensive and high accuracy can be obtained by employing the mask data that is corrected with the mask data correction apparatus 29 according to the first to eighth preferred embodiments. In manufacturing a semiconductor device such as a semiconductor integrated circuit, the use of such a specific transfer mask can provide the semiconductor device of inexpensive and high reliability. This is true for other devices having a pattern structure (e.g., crystal liquid display devices), without limiting to semiconductor devices. A method of manufacturing these devices has fully been described with reference to FIGS. 10A to 10F and FIG. 1I in the second preferred embodiment, and further description thereof is thus omitted. As shown in FIG. 3, after passing through steps S5 to S7 illustrated in FIGS. 10A to 10F or FIG. 11, additional processes of over several steps are usually performed to complete, as a product, a device having a pattern structure, e.g., a semiconductor device or liquid crystal display device.

Tenth Preferred Embodiment

The up sampling unit 44 of the seventh preferred embodiment can be configured as an up sampling apparatus independent from the mask data correction apparatus 29, by adding the Fourier transformation part and inverse Fourier transformation part. Similarly, the down sampling unit 45 can be configured as a down sampling apparatus independent from the mask data correction apparatus 29, by adding the Fourier transformation part and inverse Fourier transformation part. A tenth preferred embodiment is directed to the up sampling apparatus and down sampling apparatus so configured.

Figure 28:
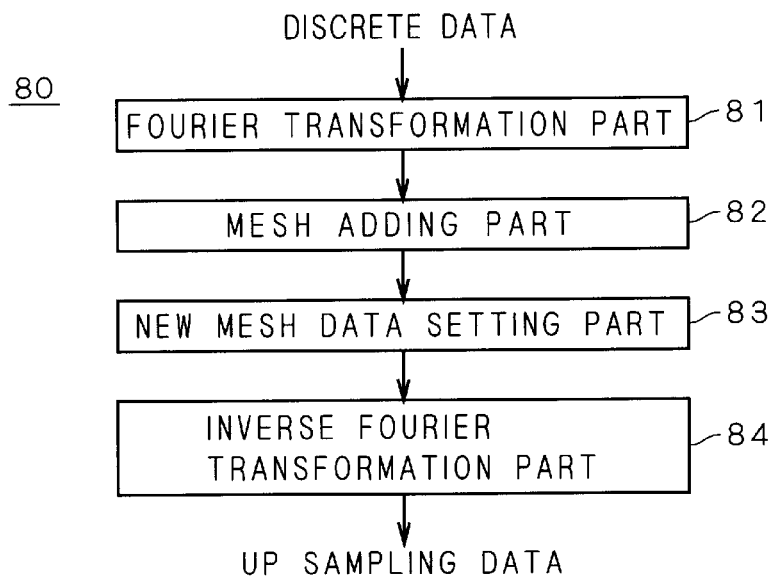
FIG. 28 is a block diagram illustrating a configuration of an up sampling unit.
Figure 29:
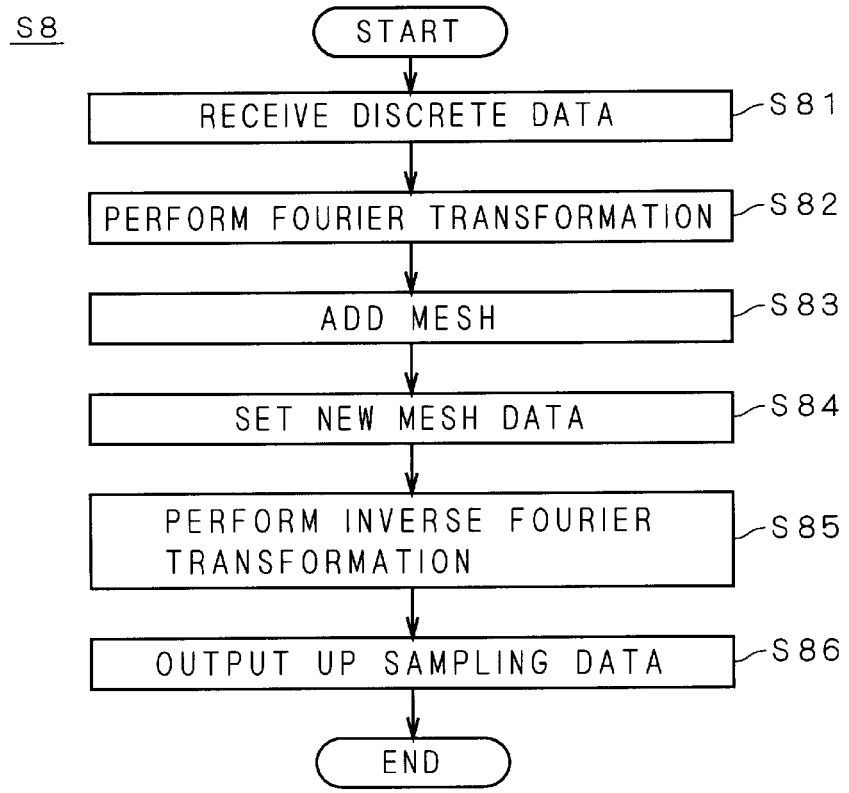
FIG. 29 is a flow chart illustrating the process performed by the up sampling unit.
Figure 32:
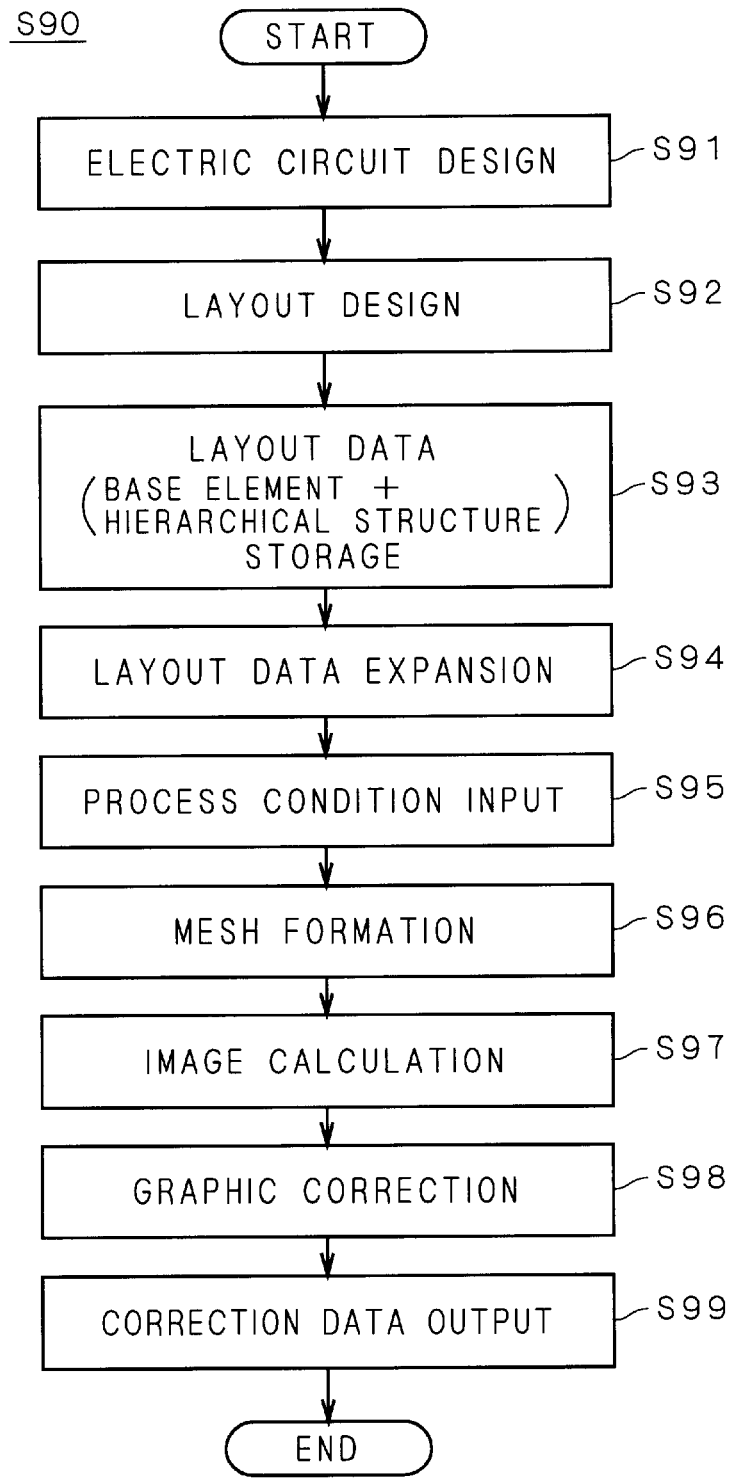
FIG. 32 is a flow chart illustrating a procedure of a conventional mask data correction method.
Figure 33:
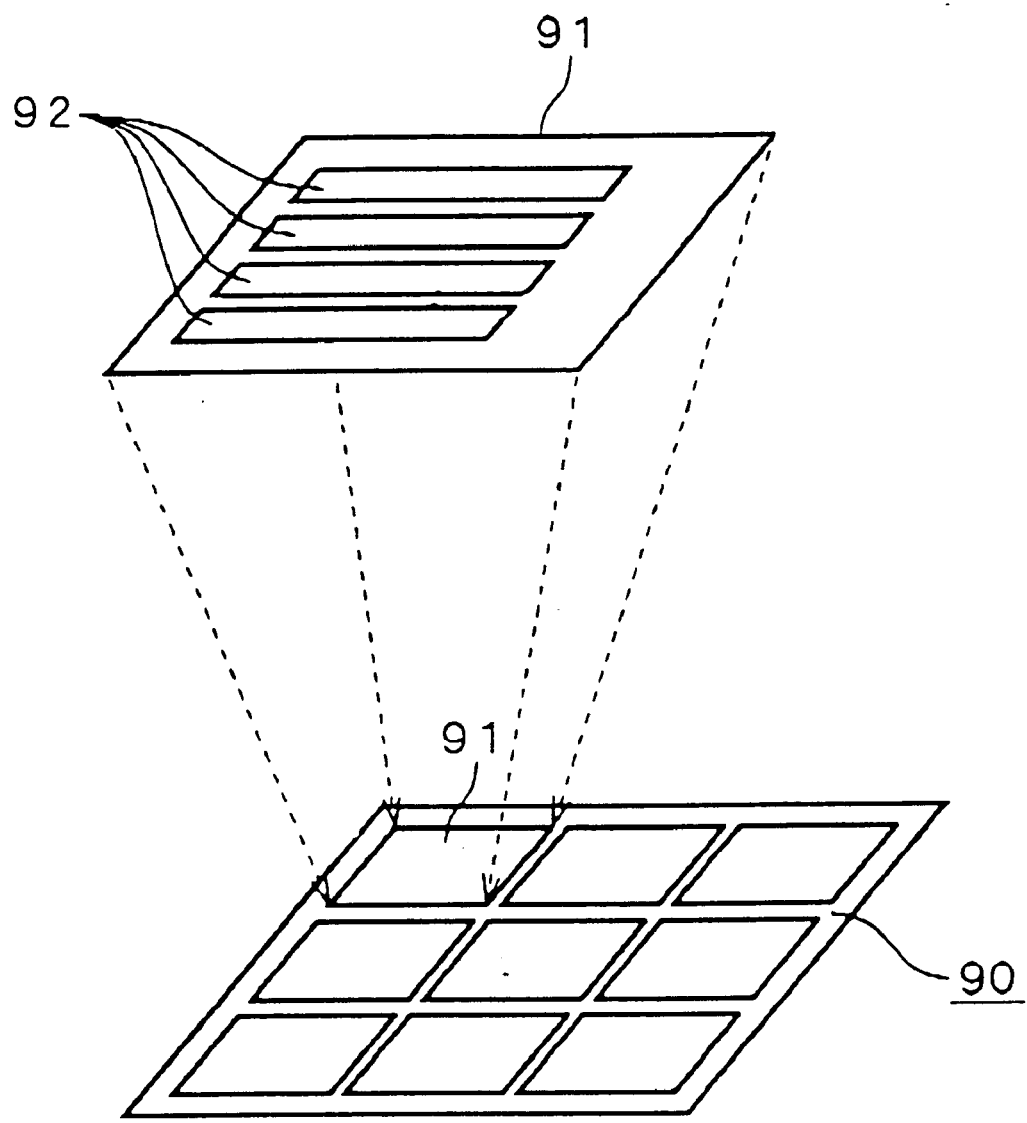
FIG. 33 is an explanatory diagram illustrating a hierarchical structure employed in the conventional mask data correction method.

FIG. 28 is a block diagram illustrating a configuration of an up sampling unit 80 according to the tenth preferred embodiment. FIG. 29 is a flow chart illustrating a procedure of step (S8) in the up sampling unit 80. The unit 80 initially receives a discrete data defined in one or more dimensional space (S81). A Fourier transformation part 81 performs Fourier transformation of the received discrete data (S82), thereby transforming the discrete data into a set of frequency components. In a mesh adding part 82, the set of frequency components is regarded as a set of data on meshes set in Fourier space of the same dimension as the above-mentioned one or more dimension, thereby to add a new mesh into the Fourier space (S83).

A new mesh data setting part 83 sets the value of zero to the data on the added mesh, and outputs the result together with the data on the mesh before addition (S84). An inverse Fourier transformation part 84 performs inverse Fourier transformation of the data from the mesh data setting part 83, to obtain an up sampling data (S85), and then outputs the obtained up sampling data (S86).

Since up sampling is performed in Fourier space in the up sampling unit 80, there is performed interpolation reflecting the entire set of discrete data. Thereby, the data after up sampling processing is smooth and natural, which cannot be obtained merely by linear interpolation or the like.

FIG. 30 is a block diagram illustrating a configuration of the down sampling unit 90 according to the tenth preferred embodiment. FIG. 31 is a flow chart illustrating a procedure of step (S9) performed in the down sampling unit 90. The unit 90 initially receives a discrete data defined in one or more dimensional space (S81). The Fourier transformation part 81 performs Fourier transformation of the received discrete data (S82), thereby transforming the discrete data into a set of frequency components.

A mesh removing part 85, regarding the set of frequency components as a set of data on meshes set in Fourier space of the same dimension as the above-mentioned one or more dimension, removes some of meshes in the Fourier space, and outputs the resulting data (S87). The inverse Fourier transformation part 84 performs inverse Fourier transformation of the data from the mesh removing part 85, thereby to obtain a down sampling data (S85), and then outputs the obtained down sampling data (S88).

Since down sampling is performed in Fourier space in the down sampling unit 90, there is performed interpolation reflecting the entire set of discrete data. Thereby, although the number of samplings is reduced, the data after down sampling is smooth and natural, which cannot be obtained merely by linear interpolation or the like.

While the invention has been shown and described in detail, the foregoing description is in all aspects illustrative and not restrictive. It is therefore understood that numerous modifications and variations can be devised without departing from the scope of the invention.

What is claimed is:

1. A mask data correction apparatus in which, based on (1) a layout data defining a shape of base elements of a graphic having a hierarchical structure, (2) said hierarchical structure, and (3) a manufacturing process condition, a mask data expressing a pattern form of a transfer mask used in said manufacturing process is created in such a manner as to suppress a distortion expected in said manufacturing process, said mask data correction apparatus comprising:

a Fourier transformation part configured to obtain Fourier images of said base elements by performing Fourier transformation of said base elements;

a synthesizing part configured to obtain a Fourier image of said graphic by synthesizing said Fourier images of said base elements in Fourier space, based on said hierarchical structure;

a spatial filter part configured to subject said Fourier image of said graphic to spatial filter processing corresponding to said distortion;

an inverse Fourier transformation part configured to subject said Fourier image after said spatial filter processing to an inverse Fourier transformation, thereby to obtain the inverse Fourier image reflecting said distortion;

a graphic transformation part configured to transform said inverse Fourier image into an output graphic; and a graphic correction part configured to correct said graphic defined by said layout data in such a direction as to suppress said distortion by comparing said output graphic outputted from said graphic transformation part with said graphic defined by said layout data, and to output a result as said mask data.

2. The mask data correction apparatus according to claim 1, wherein
said distortion includes a drawing distortion caused when said transfer mask is formed by electron beam drawing based on said mask data.

3. The mask data correction apparatus according to claim 1, wherein
said distortion includes a transfer distortion caused in a transfer image when transfer is performed by using said transfer mask formed based on said mask data.

4. The mask data correction apparatus according to claim 1, wherein
said distortion includes an etching distortion caused in an etching pattern when selective etching is performed by using a resist pattern formed by transferring said transfer mask formed based on said mask data.

5. The mask data correction apparatus according to claim 1, wherein
said distortion includes a polishing distortion caused in a polished pattern when polishing processing of a deposited film is performed after selective etching is performed with a resist pattern formed by transferring said transfer mask formed based on said mask data.

6. The mask data correction apparatus according to claim 1, wherein
said distortion includes an etch back distortion caused in the pattern subjected to etch back when etch back processing of a deposited film is performed after selective etching is performed with a resist pattern formed by transferring said transfer mask formed based on said mask data.

7. The mask data correction apparatus according to claim 1, wherein
said Fourier transformation part comprises:
a graphic dividing part configured to divide each of said base elements into a group of element graphics in a form of a triangle, tetragon, or circle; and
an element graphic Fourier transformation part configured to perform Fourier transformation for each element graphic of said group of element graphics to obtain respective Fourier images of said group of element graphics.

8. The mask data correction apparatus according to claim 7, wherein
said element graphic Fourier transformation part is configured to perform integral calculation analytically by using a primitive function when calculation of spatial frequency components is made to obtain said Fourier image.

9. The mask data correction apparatus according to claim 1, further comprising:
a mesh forming part configured to set an image forming region in real space and said Fourier space and to set meshes in said image forming region,
said mesh forming part comprising:
a minimum correlation distance calculating part configured to calculate a minimum correlation distance in said manufacturing process based on said manufacturing process condition; and
a mesh number optimizing part configured to determine a number of meshes along two directions crossing in said image forming region such that a mesh width is largest in a range not exceeding said minimum correlation distance and the number of meshes is a positive integer.

10. The mask data correction apparatus according to claim 9, wherein
said mesh number optimizing part is configured to limit said positive integer to a positive integer n that is defined by $n=2^i 3^j 5^k$, wherein i, j, and k are each zero or a positive integer; and
said Fourier transformation part is configured to perform said Fourier transformation by using fast Fourier transformation.

11. The mask data correction apparatus according to claim 1, further comprising:
a mesh forming part configured to set an image forming region in real space and said Fourier space and to set meshes in said image forming region;
a mesh adding part configured to add a new mesh into the image data obtained after said spatial filter processing; and
a new mesh data setting part configured to set a value of zero to image data on said added mesh and to output a result together with said image data before said mesh is added, and
wherein said inverse Fourier transformation part is configured to perform said inverse Fourier transformation of the image data outputted from said new mesh data setting part.

12. The mask data correction apparatus according to claim 1, further comprising:
a mesh forming part configured to set an image forming region in real space and said Fourier space and to set meshes in said image forming region; and
a mesh removing part configured to remove meshes from image data obtained after said spatial filter processing, and wherein said inverse Fourier transformation part is configured to perform said inverse Fourier transformation of image data outputted from said mesh removing part.

13. An up-sampling apparatus for subjecting a discrete data defined in one or more dimensional space to up sampling, said apparatus comprising:

a Fourier transformation part configured to transform said discrete data into a set of frequency components by performing a Fourier transformation of said discrete data;

a mesh adding part configured to make said set of frequency components into data on a first mesh set in Fourier space of a same dimension as said one or more dimensional space, and to add a new mesh into said first mesh set in Fourier space;

a new mesh data setting part configured to set data on said new mesh to zero and to output the result together with said data on said first mesh; and an inverse Fourier transformation part configured to perform an inverse Fourier transformation of data outputted from said new mesh data setting part.

14. A down-sampling apparatus for subjecting a discrete data defined in one or more dimensional space to down sampling, said apparatus comprising:

a Fourier transformation part configured to transform said discrete data into a set of frequency components by performing a Fourier transformation of said discrete data;

a mesh removing part configured to make said set of frequency components into data on meshes set in Fourier space of a same dimension as said one or more dimensional space, and to output a result after removing a part of said meshes in said Fourier space; and an inverse Fourier transformation part configured to perform an inverse Fourier transformation of data outputted from said mesh removing part.

15. A method of manufacturing a device having a pattern structure comprising:

(a) preparing a mask data correction apparatus in which, based on (1) a layout data defining the shape of base elements of a graphic having a hierarchical structure, (2) said hierarchical structure, and (3) a manufacturing process condition, a mask data expressing a pattern form of a transfer mask used in said manufacturing process is created in such a manner as to suppress a distortion expected in said manufacturing process, said mask data correction apparatus comprising:

a Fourier transformation part configured to obtain Fourier images of said base elements by performing Fourier transformation of said base elements;

a synthesizing part configured to obtain a Fourier image of said graphic by synthesizing said Fourier images of said base elements in Fourier space, based on said hierarchical structure;

a spatial filter part configured to subject said Fourier image of said graphic to spatial filter processing corresponding to said distortion;

an inverse Fourier transformation part configured to subject said Fourier image after said spatial filter processing to an inverse Fourier transformation, thereby to obtain the inverse Fourier image reflecting said distortion;

a graphic transformation part configured to transform said inverse Fourier image into an output graphic; and a graphic correction part configured to correct said graphic defined by said layout data in such a direction as to suppress said distortion by comparing said output graphic outputted from said graphic transformation part with said graphic defined by said layout data, and to output a result as said mask data;

(b) creating a mask data by using said mask data correction apparatus;

(c) forming a transfer mask by using said mask data created in said step (b);

(d) forming a resist on a surface of a material of a device to be manufactured;

(e) transferring said transfer mask formed in said step (c) to said resist;

(f) patterning said resist in a pattern form transferred in said step (e); and (g) performing selective processing of said material by using the patterned resist as a shield.

* * * * *